United States Patent [19]

Sakurai et al.

[11] Patent Number: 5,253,156

[45] Date of Patent: Oct. 12, 1993

[54] SEMICONDUCTOR INTEGRATED CIRCUIT UNIT

[75] Inventors: Naoki Sakurai; Mutsuhiro Mori, both of Hitachi; Hidetoshi Arakawa, Kitaibaraki; Kenichi Onda, Hitachi; Hideki Miyazaki, Hitachi; Akihiko Kanouda, Hitachi, all of Japan

[73] Assignees: Hitachi, Ltd., Hitachi; Hitachi Haramachi Semi-Conductor, Ltd., Tokyo, both of Japan

[21] Appl. No.: 647,415

[22] Filed: Jan. 29, 1991

[30] Foreign Application Priority Data

Jan. 31, 1990 [JP] Japan .................. 2-019070

[51] Int. Cl.[5] .................. H02M 3/335; H02M 7/521
[52] U.S. Cl. .......................... 363/98; 363/37; 363/56; 363/147
[58] Field of Search .............. 363/98, 56, 147, 37, 363/132, 131; 257/678, 684, 146, 368

[56] References Cited

U.S. PATENT DOCUMENTS

| | | | |
|---|---|---|---|
| 4,068,295 | 1/1978 | Portmann | 363/60 |
| 4,445,167 | 4/1984 | Okado | 363/56 |
| 4,482,985 | 11/1984 | Itoh et al. | 365/226 |
| 4,719,555 | 12/1988 | Hattori et al. | 363/56 |
| 4,730,241 | 3/1988 | Takaya | 363/19 |
| 4,749,849 | 6/1988 | Hoeberechts et al. | 250/203 R |
| 4,829,415 | 5/1989 | Haferl | 363/26 |
| 4,862,344 | 8/1989 | Emoto | 363/147 |
| 4,918,590 | 4/1990 | Ohtuka et al. | 363/37 |
| 4,928,220 | 5/1990 | White | 363/56 |
| 4,965,710 | 10/1990 | Pelly et al. | 363/56 |
| 4,975,825 | 12/1990 | Huss et al. | 363/141 |
| 4,989,127 | 1/1991 | Wegener | 363/16 |
| 5,043,859 | 8/1991 | Korman et al. | 363/147 |
| 5,045,988 | 9/1991 | Gritter et al. | 363/35 |

Primary Examiner—Emanuel T. Voeltz
Assistant Examiner—Ben Davidson
Attorney, Agent, or Firm—Antonelli, Terry, Stout & Kraus

[57] ABSTRACT

A semiconductor integrated circuit unit, suitable for the control of a motor, has an integrated structure within the same semiconductor substrate, comprising an inverter circuit, drive circuits for driving the switching elements of the inverter circuit, an internal power source circuit for supplying power to the drive circuits which drive the upper arm side of the inverter circuit, and a logical circuit for transmitting a signal to the drive circuits which drive the upper arm side of the inverter circuit.

5 Claims, 18 Drawing Sheets

SEMICONDUCTOR INTEGRATED CIRCUIT UNIT

BACKGROUND OF THE INVENTION

The present invention relates to a semiconductor circuit unit, and more particularly to a semiconductor integrated circuit unit storing an inverter circuit and a drive circuit in the same semiconductor substrate.

A system for controlling a motor through an inverter circuit by receiving a power supply from a power source of 100 V or above has so far had such a configuration that inverter circuit is structured by individual elements and its drive circuit is structured by an integrated circuit (hereinafter referred to as an IC), as discussed in the PESC '88 RECORD, April 1988, in Sections 1319 to 1323.

According to such a conventional technique as described above, however, there are following problems because an inverter circuit is structured by individual elements (1) inverter circuit becomes larger and (2) wiring between the individual elements of the inverter circuit and the driving IC is considerably long, thereby causing a high potential which subjects the inverter to a possible malfunction due to noise.

SUMMARY OF THE INVENTION

It is an object of the present invention to provide a semiconductor integrated circuit unit which can solve the above problems of the prior art.

Other objects of the present invention will become clear from the following explanation.

The semiconductor integrated circuit unit of the present invention which achieves the above object is characterized in that the inverter circuit and its drive circuit are integrated on one and the same semiconductor substrate. To be more specific, the present invention is characterized in that a plurality of switching elements and diodes for structuring the inverter circuit are separately formed in each island area of a dielectric isolated substrate and that the drive circuit is formed in an island area for each circuit or for each optionally divided circuit unit in accordance with an operation voltage.

DESCRIPTION OF THE PREFERRED EMBODIMENTS

Embodiments of the present invention will be described in detail for each of the following items: (1) the configuration of the motor control system, (2) the configuration and operation of the integrated circuit unit, (3) the switching elements, (4) the structure of the lateral IGBT (LIGBT), (5) the diodes, (6) electron beam irradiation, (7) the layout of the IC, and (8) the IC manufacturing process.

Configuration of the Motor Control System

Figure 1:
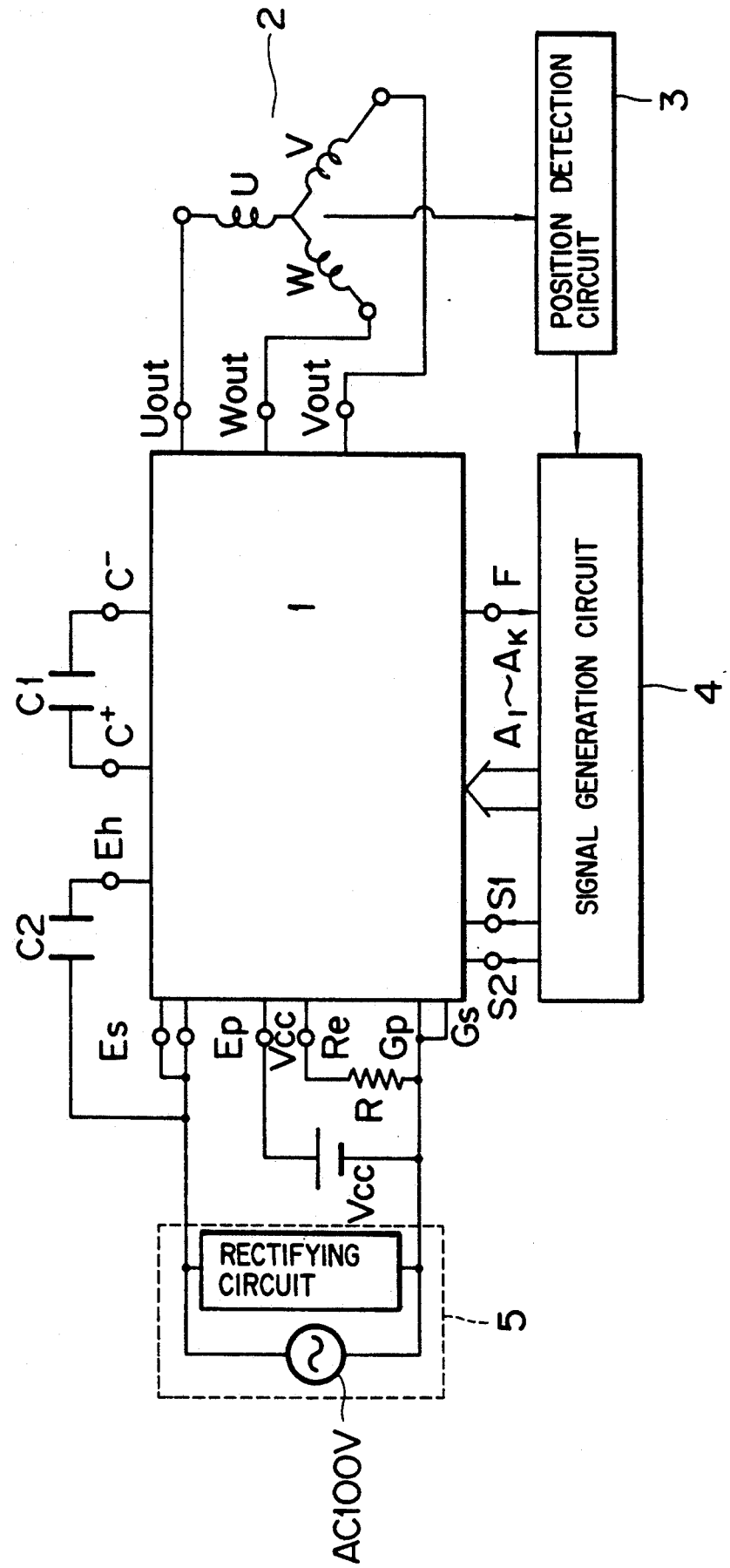
FIG. 1 is a block diagram of a motor control system using the integrated circuit unit of the present invention.

The configuration of the control system for a three-phase DC brushless motor using the integrated circuit unit of the present invention will be explained with reference to FIG. 1. The motor desirably has 5 to 200 W. This system comprises an integrated circuit unit 1 of the present invention, a motor 2, a rotor position detection circuit 3, a signal generation circuit 4, a power source circuit 5, capacitors C1 and C2 and a resistor R. The positional detection circuit 3 and the signal generation circuit 4 may be incorporated in the IC.

The operation of this system will be explained below. With DC rectified to AC 100 V as a power source, the IC unit 1 supplies a desired three-phase AC power to the motor 2. The IC unit 1 also receives a low voltage power supply Vcc as a power source for the control circuit. The IC unit 1 transfers the charge stored in the capacitor C1 at the low voltage side to the capacitor C2 at the high potential side within the IC unit 1, and uses the capacitor C2 as a power source for the upper arm drive circuit. In order to control the motor 2, the position of the rotor of the motor is detected by the position detection circuit 3 and then the signal generation circuit 4 generates signals $A_1$ to $A_K$ for controlling the current which flows through the motor. The value of K needs to be equal to the number of phases of the motor or larger, and 3 or above in the case of the present embodiment.

The signal generation circuit 4 generates a carrier signal S1 for controlling the pulse width modulation of the current flowing to the motor, and a carrier signal S2 for shifting the charge of the capacitor C1 to the capacitor C2. The IC unit 1 converts the DC into a three-phase AC of desired frequency and current by the signals $A_1$ to $A_K$ and the signal S1, and supplies the three-phase AC to the motor. The IC generates a fault signal F when the current flowing to the motor becomes a certain value or higher. A decision of an occurrence of a fault or not is made by comparing the current flowing through the resistor R and a part of the current extracted from the current flowing to the motor. The IC also generates a fault signal F when the temperature of the IC exceeds a certain level.

It is desirable that the frequency of the carrier signal S1 for the pulse width modulation is 16 kHz or higher which is higher than the frequency audible by a human ear. By this arrangement, noise is not generated.

Configuration and Operation of the Integrated Circuit

Figure 2:
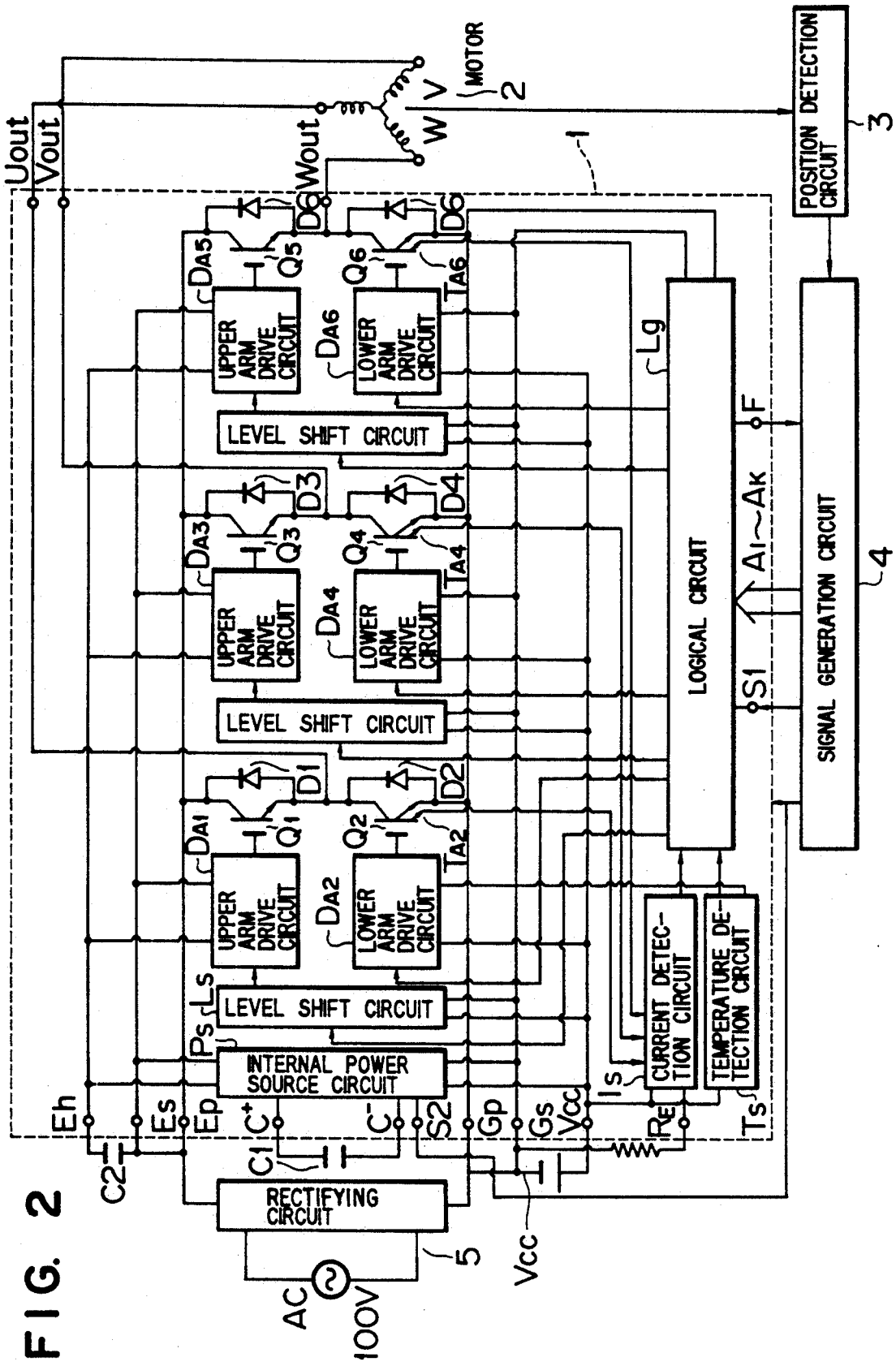
FIG. 2 is a block diagram showing the configuration of the integrated circuit unit of the present invention.

The configuration of the integrated circuit unit 1 of the present invention will be explained below with reference to FIG. 2. In the present embodiment, those portions encircled by a dotted line are integrated in one chip. This integrated circuit unit comprises a three-phase inverter circuit including switching elements $Q_1$ to $Q_6$ and diodes $D_1$ to $D_6$ connected inverse parallel therewith, drive circuits $D_{A2}$, $D_{A4}$ and $D_{A6}$ of a lower arm switching element of the inverter circuit, drive circuit $D_{A1}$, $D_{A3}$ and $D_{A5}$ of an upper arm switching element, a level shift circuit $L_s$, a current detection circuit $I_s$ for detecting a current flowing through each of the switching elements $Q_1$ to $Q_6$, an internal power source circuit $P_s$ and a logical circuit $L_g$.

The operation of the integrated circuit unit 1 of the present invention will be explained below. The logical circuit $L_g$ receives control signals $A_1$ to $A_K$ and a carrier signal $S_1$ from the signal generation circuit 4, supplies these signals to upper and lower arm drive circuits $DA_1$ to $D_{A6}$ of each phase, switches the switching elements $Q_1$ to $Q_6$, and controls the current supplied to the motor 2. The lower arm drive circuits $D_{A2}$, $D_{A4}$ and $D_{A6}$ are supplied with power from an external power source Vcc. The upper arm drive circuits $D_{A1}$, $D_{A3}$ and $D_{A5}$ are supplied with charge stored in the capacitor C2 by an internal power source circuit $P_s$. The switching by pulse width modulation is carried out by the switching elements $Q_2$, $Q_4$ and $Q_6$ at the lower arm side. This is because the capability of the upper arm drive circuit is lowered substantially at the pulse width modulated frequency since the internal power source circuit $P_s$ has shifted charge from the capacitor C1 to the capacitor C2 by the switching frequency as the pulse width modulated frequency. Further, since only the lower arm side is pulse width modulated, the upper arm drive circuit and the signal generation circuit can be made simple. Signals from the lower potential logical circuit $L_g$ to the upper arm drive circuits $D_{A1}$, $D_{A3}$ and $D_{A5}$ are transmitted through a level shift circuit $L_s$.

For the current flowing to the motor (hereinafter referred to as a main current), a part of the current taken from the current flowing through the lower arm side switching elements $Q_2$, $Q_4$ and $Q_6$ is compared with a reference current which flows through the resistor R connected to the outside of the IC unit. When the current taken from the current flowing through the lower arm side switching elements $Q_2$, $Q_4$ and $Q_6$ becomes larger than the current flowing through the resistor R, a fault signal F is sent from the logical circuit $L_g$ to the signal generation circuit 4.

When the temperature becomes higher than that of the temperature detection circuit $T_s$, the logical circuit $L_g$ transmits a fault signal F to the signal generation circuit 4.

The wiring for the AC 100 V rectified DC high voltage is divided into a wiring $E_p$ through which the main current flows and a wiring $E_s$ through which a small current for the drive circuits flows. Also, the wiring for the ground potential is divided into a wiring $G_p$ through which the main current flows and a wiring $G_s$ through which a small current for the drive circuits and logical circuit flows. $E_s$ and $E_p$ are mutually connected and $G_p$ and $G_s$ are mutually connected outside the IC respectively. By dividing the wiring of the main current from the wiring of a small current, a variation of the potential due to a variation of the main current does not affect the drive circuits.

Switching Elements

LIGBT's are used for the switching elements $Q_1$ to $Q_6$ in the present embodiment, for the following reasons.

The integrated circuit unit of the present invention uses DC rectified the commercial AC 100 V as a power source. Therefore, a high voltage is applied to part of the elements of the switching elements $Q_1$ to $Q_6$, the diodes $D_1$ to $D_6$, the drive circuits $D_{A1}$, $D_{A3}$ and $D_{A5}$ of the upper arm switching element, the level shift circuit $L_s$ and the internal power source circuit $P_s$. DC rectified an AC 100 V is about 145 V. Considering this voltage and power source variations and a voltage increase at the time of switching, a blocking voltage of these elements needs to be 250 V or above. Therefore, a dielectric isolated substrate is used as a semiconductor substrate. The dielectric isolated substrate uses polysilicone, for example, as a supporting unit and covers an island-shaped monocrystalline silicon area forming the element with $SiO_2$, thereby to improve insulation blocking voltage between the elements.

The pulse width modulated frequency of the switching element used in the integrated circuit of the present invention is 16 kHz or above. Therefore, it is necessary to carry out a switching operation at a high speed of 16 kHz or above. There is a metal oxide semiconductor field effect transistor (hereinafter referred to as MOSFET) which is a switching element that effects a switching operation at a frequency of 16 kHz or above and that has a high blocking voltage of 250 V or above. In the dielectric isolated substrate, there are a vertical element that fows a current by using a buried layer of low resistance at the bottom of a monocrystalline island and a lateral element that flows a current in the direction parallel with the main surface, with little current flow through the buried layer.

Figure 3:
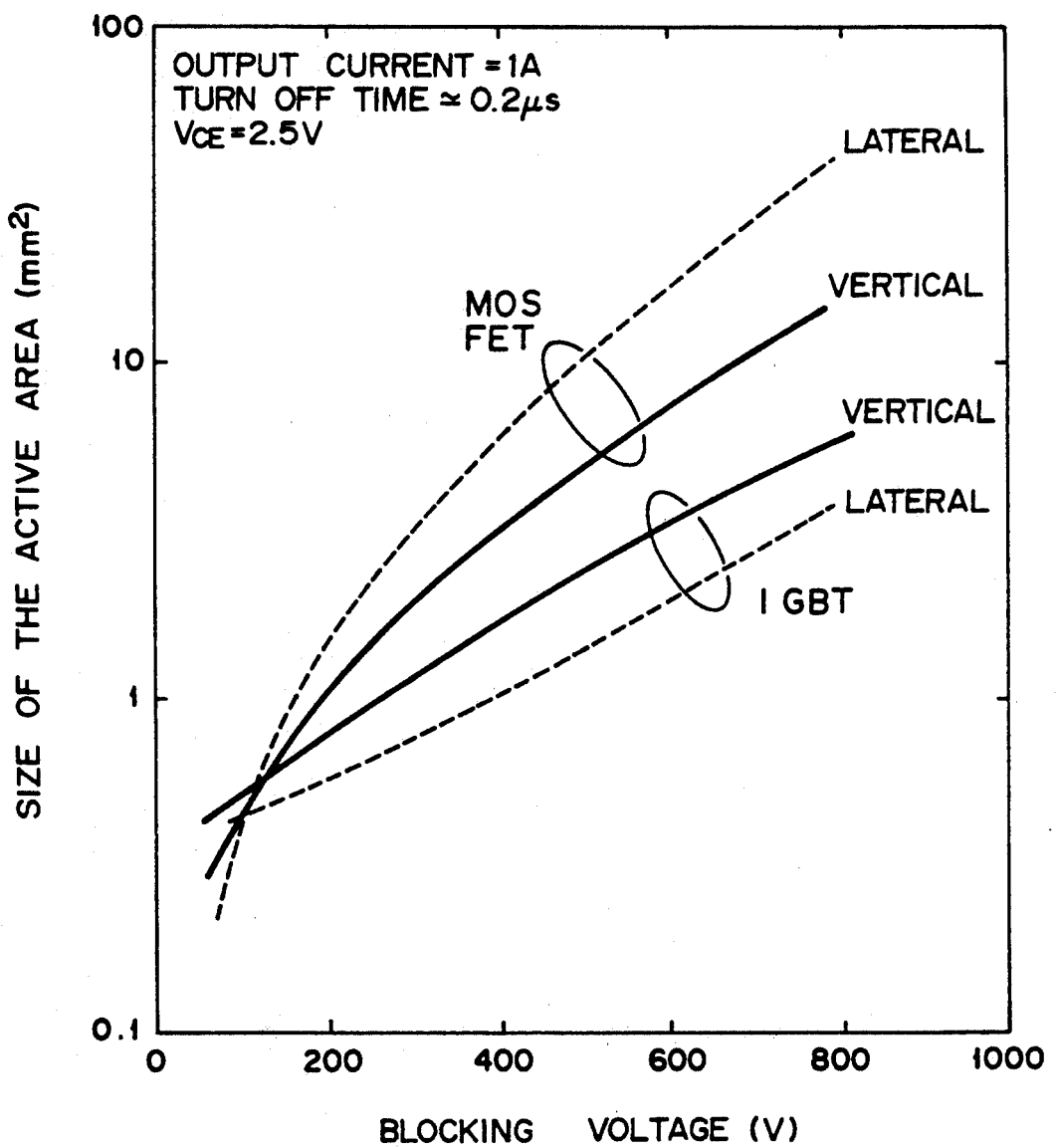
FIG. 3 is a diagram showing the relationship between blocking voltage and the active area which is necessary to flow a current of 1 A of the switching elements formed on the dielectric isolated substrate.

FIG. 3 shows the result of calculation to obtain a relationship between the blocking voltage and the active area (which is the area obtained by excluding the electric field reducing area from the element area), at the current 1A, for both the vertical and lateral elements of the MOSFET and the IGBT respectively. It is understood from the diagram that at the blocking voltage of 100 V and above, the area of the IGBT can be made smaller than that of the MOSFET. This is because, in the case of the IGBT, a high reistance $n^-$ layer which reduces the electric field by expanding a depletion layer during the off period becomes a low resistance layer by being conductivity modulated during the on period. It is also understood that, in the case of the IGBT, the area of the lateral element can be made smaller than that of the vertical element. This is because the vertical element uses a buried layer to flow a current and is influenced by the resistance of the buried layer, whereas the lateral element has no such problem.

Figure 4:
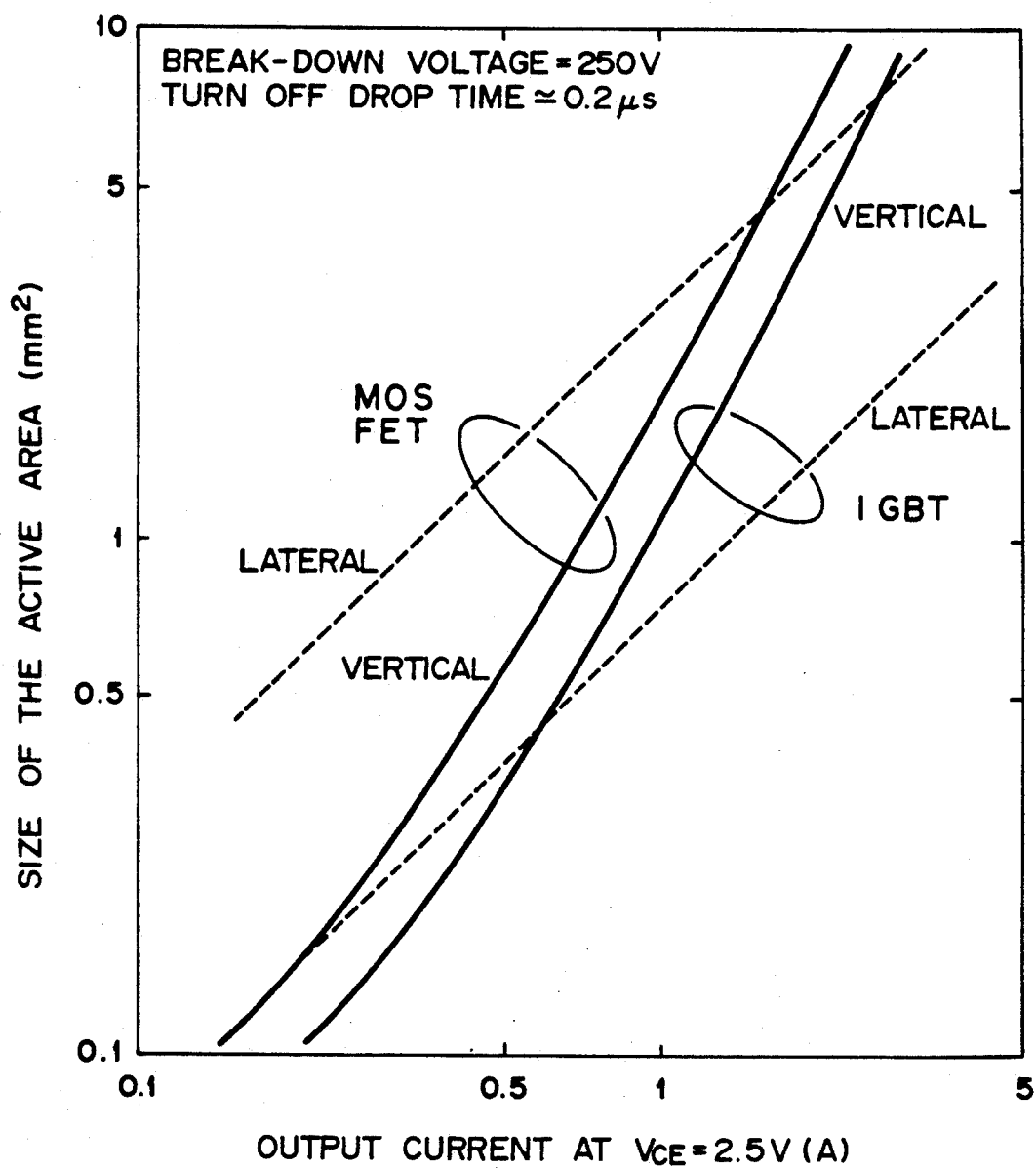
FIG. 4 is a diagram showing the relationship between the active area and the output current at the blocking voltage of 250 V of the switching elements formed on the dielectric isolated substrate.

FIG. 4 shows the result of calculation to obtain a relationship between the output current and the active area for the MOSFET and the IGBT of the blocking voltage 250 V. It is understood from the diagram that, in the low current area, the lateral element requires a larger area than the vertical element in order to obtain the same output current, for both the IGBT and the MOSFET. In the case of the lateral element, usually the emitters (source) and the collectors (drain) sandwich the n⁻ layer to have an alternate layout on the same plane. Therefore, it is natural that, at the same output current, the lateral element requires a larger area than the vertical element in which collectors are collectively formed. However, when the output current increases, the current increases in proportion with the area in the case of he lateral element, whereas in the case of the vertical element, an active area needs to be larger at the rate higher than that of the increase in the current because of the resistance of the buried layer in the vertical element. As a result, in the case of the IGBT, the lateral element can have a smaller area than the vertical element at 0.6 A or above.

As described above, the blocking voltage of the switching element of the integrated circuit according to the present invention needs to be 250 V or above. Most of the brushless motors require a current of 0.6 A or above. Accordingly, for the switching element of the integrated circuit unit of the present invention, it is the most desirable selection to use the LIGBT of which active area is the smallest among the switching elements, with the blocking voltage 250 V or above and the current 0.6 A or above.

Structure of the LIGHT

Perspective View

Figure 5:
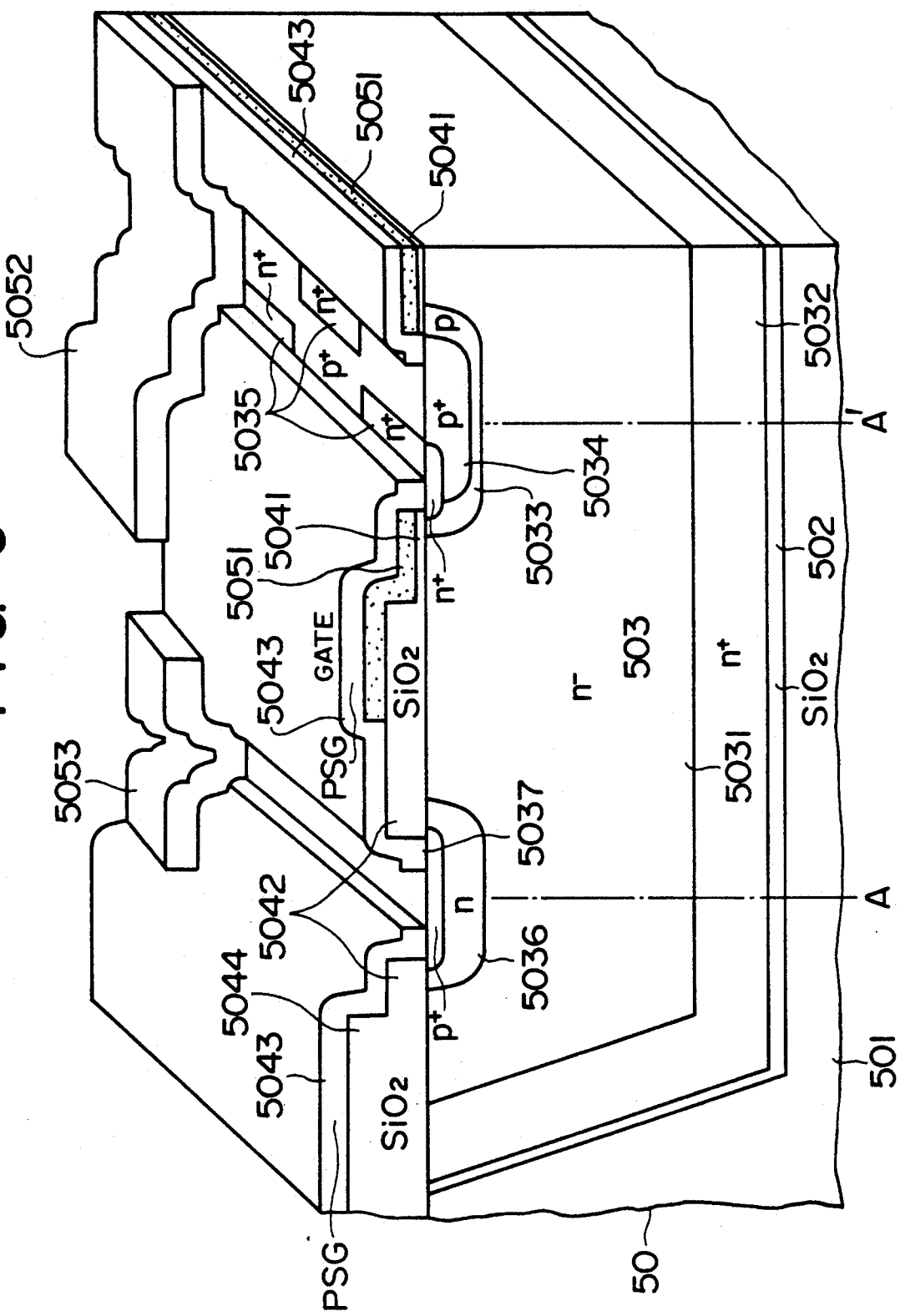
FIG. 5 is a perspective cross sectional view of the lateral insulation gate bipolar transistor (LIGBT)

FIG. 5 is a perspective view showing the LIGBT which is used for the switching element of the inverter circuit.

Each one of the LIGBT is formed in each one of island area 503 of a dielectric isolated substrate 50 which comprises a plurality of island areas 503 of monocrystalline silicon through an $SiO_2$ film 502 on a supporting body of polysilicon 501. The land area 503 includes a n⁻ lay 5031 and a n+ layer 5032 which is formed between the n⁻ layer 5031 and the $SiO_2$ film 502. In the n⁻ layer 5031, at least one stripe p layer 5033 is formed with its surface disclosed, and a high impurity density p+ layer 5034 is formed with its surface disclosed within the p layer 5033, and a n+ layer 5035 is formed with its surface disclosed so as to be adjacent with the p layer 5033 and the p+ layer 5034. The n+ layer 5035 has such a structure that a part of the layer is removed at a predetermined interval along the longitudinal direction of the p layer 5033. Within the n⁻ layer 5031, a n layer 5036 is formed with a distance from the p layer 5033, and a p+ layer 5037 is formed with its surface disclosed within the n layer 5036. A thin $SiO_2$ film 5041 is formed across the n+ layer 5035, the p layer 5033 and the n⁻ layer 5031 on their surfaces, on top of which a polysilicone layer 5051 is formed to provide a MOS gate. The p+ layer 5034 is provided so as not to overlap the area of forming a MOS gate channel. A thick $SiO_2$ film 5042 is formed adjacent to a thin $SiO_2$ film 5041 in the direction from the p layer 5033 to the p+ layer 5037 on the surface of the n⁻ layer 5031 between the p layer 5033 and the p+ layer 5037. A polysilicone layer 5051 extends over the thin $SiO_2$ film 5041 and over the thick $SiO_2$ film 5042 to the p+ layer 5037. A PSG (Polysilica glass) 5043 is provided over the polysilicone layer 5051 and the $SiO_2$ films 5041 and 5042. An emitter electrode 5052 is provided in ohmic contact with the p+ player 5034 and the n+ layer 5031. An emitter electrode 5052 extends to the layer 5037 over the PSG 5043.

A p+ layer 5037 is in ohmic contact with a collector electrode 5053. The collector electrode 5053 further extends to the p layer 5033 over the PSG 5043. The n layer 5036 and the n+ layer 5032 are separated from each other. A thick oxide film 5044 is formed on the surface of the n+ layer 5032, on top of which is further formed a PSG 5043.

With the section from A to A' as one unit, a few repeated units provide a LIGT which can switch a large current.

The operation of the LIGBT will be explained below. In the state that the emitter 5052 is at a ground potential and the collector electrode 5053 at a positive potential, a positive potential is applied to the polysilicone layer 5051. Thus, the p layer 5033 immediately beneath the thin $SiO_2$ film 504 is inverted and a channel is formed so that an electron flows from the n+ layer 5035. By this electron, the pn junction between the p+ layer 5037 and the n layer 5036 is forward biased and hole are injected from the p+ layer 5037 to the n layer 5036 and the n⁻ layer 5031. By these injected holes, the n⁻ layer 5031 is conductivity modulated to have a lower resistance so that the LIGBT is set to the on state. When the positive potential applied to the polysilicone layer 5051 is removed, the channel is extinguished and the electron supply is stopped so that the LIGBT is set to the off state.

The injected holes reach the emitter electrode 5052 through the p layer 5033 beneath the n+ layer 5035. When the number of holes flown increases, the pn junction between the n+ layer 5035 and the p layer 5033 is forward biased by the resistance of the p layer 5033. When the value exceeds 0.7 V, the thyristor comprising the n+ layer 5035, the p layer 5033, the n⁻ layer 5031, the n layer 5036 and the p+ layer 5037 is turned on so that it can not be controlled by the polysilicone layer 5051 which is the gate. This is called latch-up. In order to make the resistance of the p layer 5033 smaller and to prevent the latch-up, the p+ layer 5034 is provided and the n+ layer 5035 is periodically removed. Further, in order to control the injection from the p+ layer 5037, the n layer 5036 is provided. Further, a depletion layer extends in the n layer 5036 to reach the p+ layer 5037, to prevent the so-called punch-through which is a reduction in the potential barrier among the p layer 5037, the n⁻ layer 5031 and the p+ layer 5037.

The polysilicone layer 5051 and the emitter electrode 5052 are extended to the p+ layer 5037 to extend the depletion layer so that the electric field near the pn junction between the p layer 5033 and the n⁻ layer 5031 is reduced and the blocking voltage is increased.

The collector electrode 5053 is extended to the p layer 5033 so that the depletion layer does not reach the p+ layer 5037, thus preventing the occurrence of a punch-through phenomenon.

The peripheral portion of the LIGBT is covered with the thick $SiO_2$ film 5044 and the PSG 5043. By this arrangement, concentration in the electric field at the peripheral portion is prevented when the wiring is drawn to connect the LIGBT to the other element.

Plan View

Figure 6A:
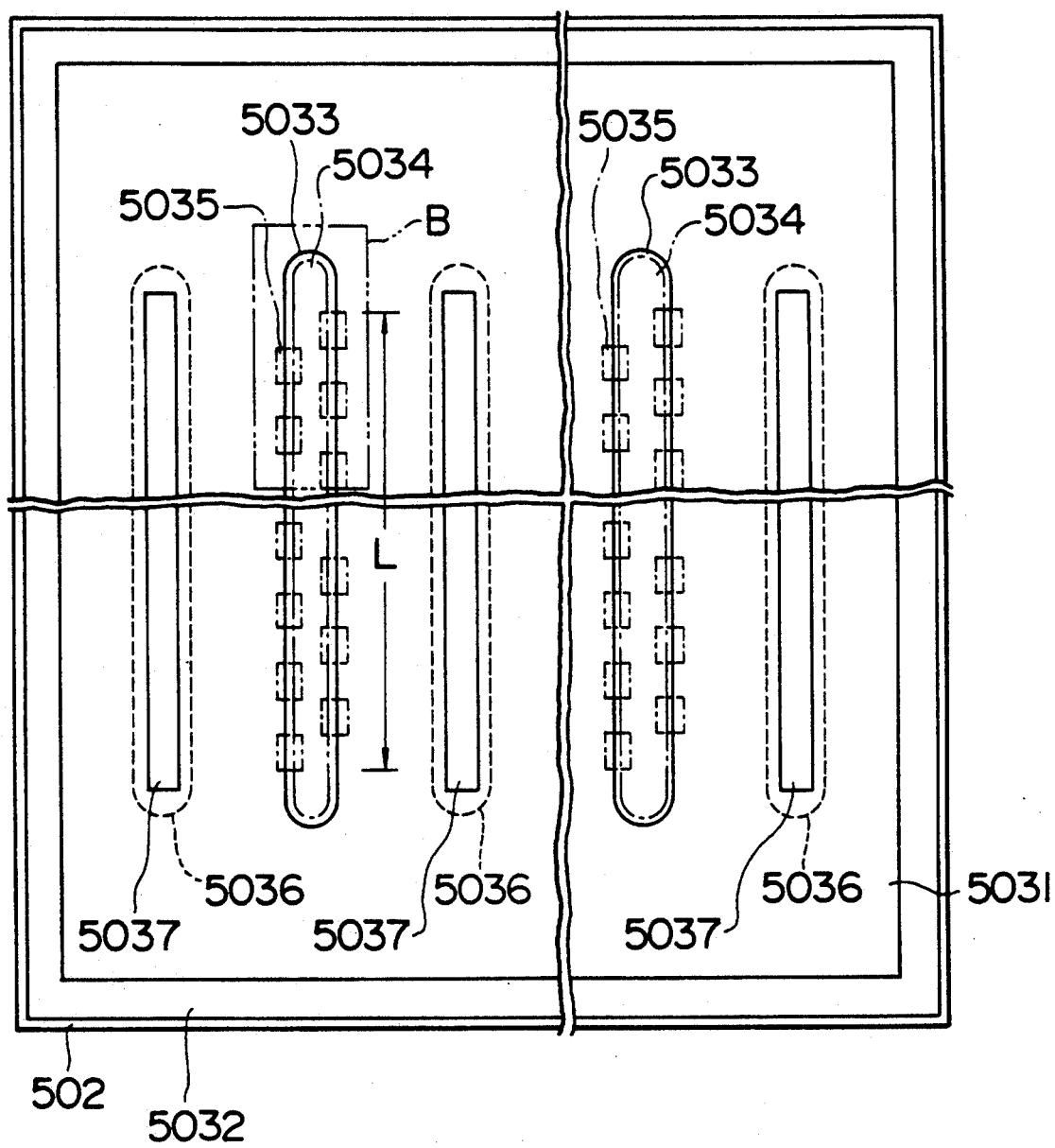
FIG. 6A is a plan view of the diffusion layer of the LIGBT.

FIG. 6A shows a plan view of one LIGBT which is used as the upper arm switching elements $Q_1$, $Q_3$ and $Q_5$. The p+ layer 5037 and the p layer 5033 are alternately formed to extend long in one direction. The p+ layer 5037 is formed on the right and left ends. The n layer 5036 is formed around the p+ layer 5037. Within the p layer 5033, the p+ layer 5034 is formed. The n+ layer 5035 comprises a plurality of areas provided cyclically along the longitudinal direction of the p layer 5033. Both ends of the longitudinal direction of the n layer 5036, the p layer 5033 and the p+ layer 5034 have a predetermined curve in order to prevent a concentration of the electric field. The length L of the n+ layer 5035 in the longitudinal direction is shorter than the length of the p+ layer 5037 in the longitudinal direction, in order to prevent an occurrence of a latch-up due to an integration of the holes at the end portion of the n+ layer 5035. Both ends of the p+ layer 5037 in the longitudinal direction have a linear shape forming the right angle with the longitudinal direction. This is based on the following reason. At the portion where a semi-circular curve is formed on both ends of the n layer 5036 in the longitudinal direction, the impurity density of the n layer 5036 is lower than any other portions (except the end portions). If the end portion of the p+ layer 5037 exists at the semi-circular portion of both ends of the n layer 5036 in the longitudinal direction, injection of positive holes from the p+ layer 5037 to the n layer 5036 increases at this portion and latch-up occurs at this portion. Therefore, in the present embodiment, a semicircular portion is not provided at both ends of the p+ layer 5037 so that an occurrence of latch-up is prevented in advance.

Figure 6B:
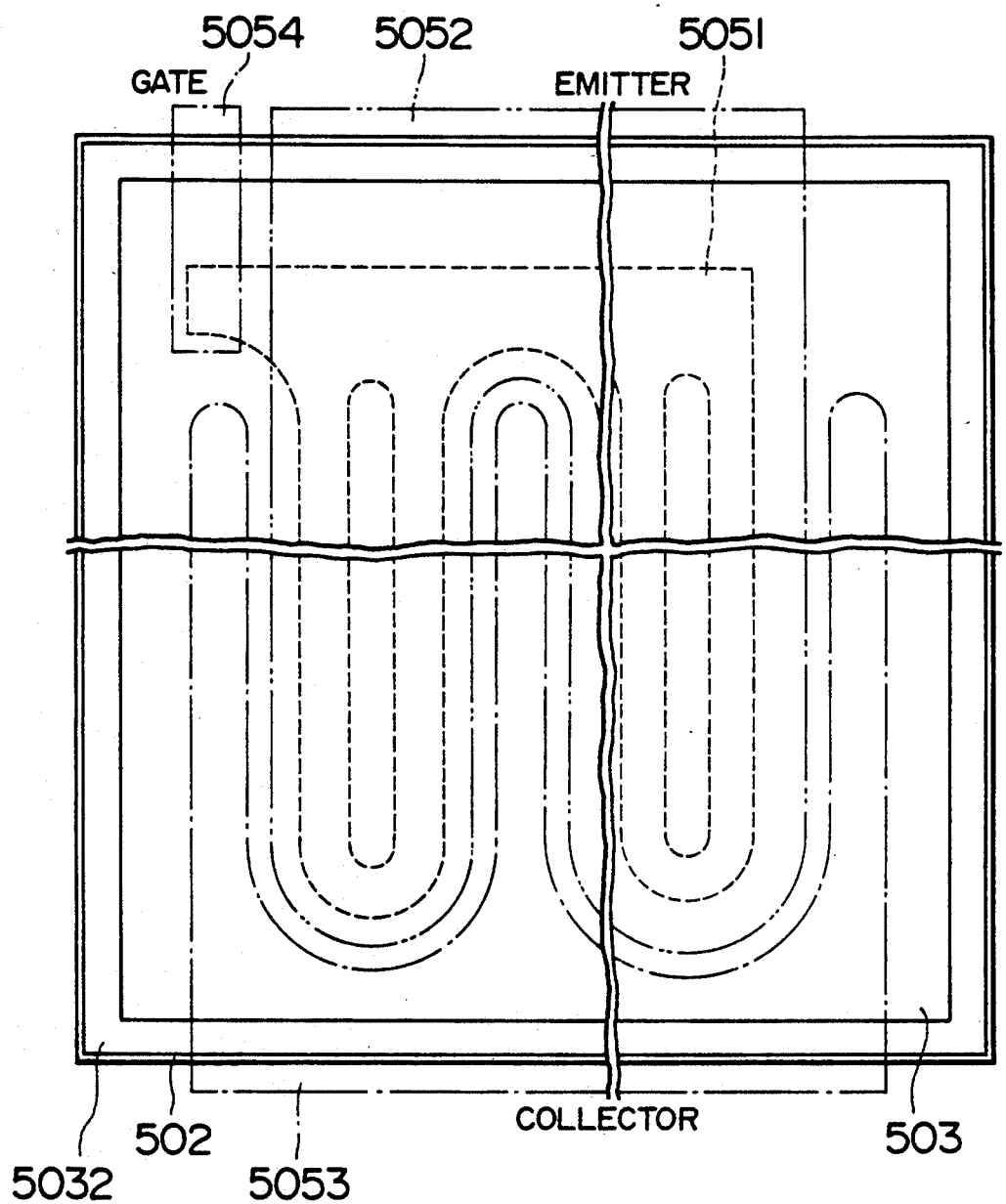
FIG. 6B is a plan view of the electrode of the LIGBT.

FIG. 6B is a plan view of the electrode of the LIGBT. The collector electrode 5053 and the emitter electrode 5052 are alternately formed to extend in one direction. The collector electrode 5053 and the emitter electrode 5052 have a predetermined curvature at a portion facing each other, to reduce the electric field. The collector electrode 5053 and the emitter electrode 5052 are drawn to the outside of the island area in mutually opposite directions in the longitudinal direction. The polysilicone layer 5051 and the collector electrode 5053 are alternately formed and the center portion is removed in the longitudinal direction. The p layer 5033 is formed by injecting boron in the region longer by a predetermined length than the length of the portion from which the polysilicone layer 5051 has been removed and by heat processing the injected boron. The polysilicone layer 5051 is in ohmic contact with the gate electrode 5054 at the end portion, and the polysilicone layer 5051 is guided to the outside of the island area 503 by the gate electrode 5054. The thick oxide film 5044 and the PSG 5043 are formed on the n+ layer 5032, the collector electrode 5053, the emitter electrode 5052 and the gate electrode 5054.

LIGBT Having the Current Detection Terminal

Figure 7:
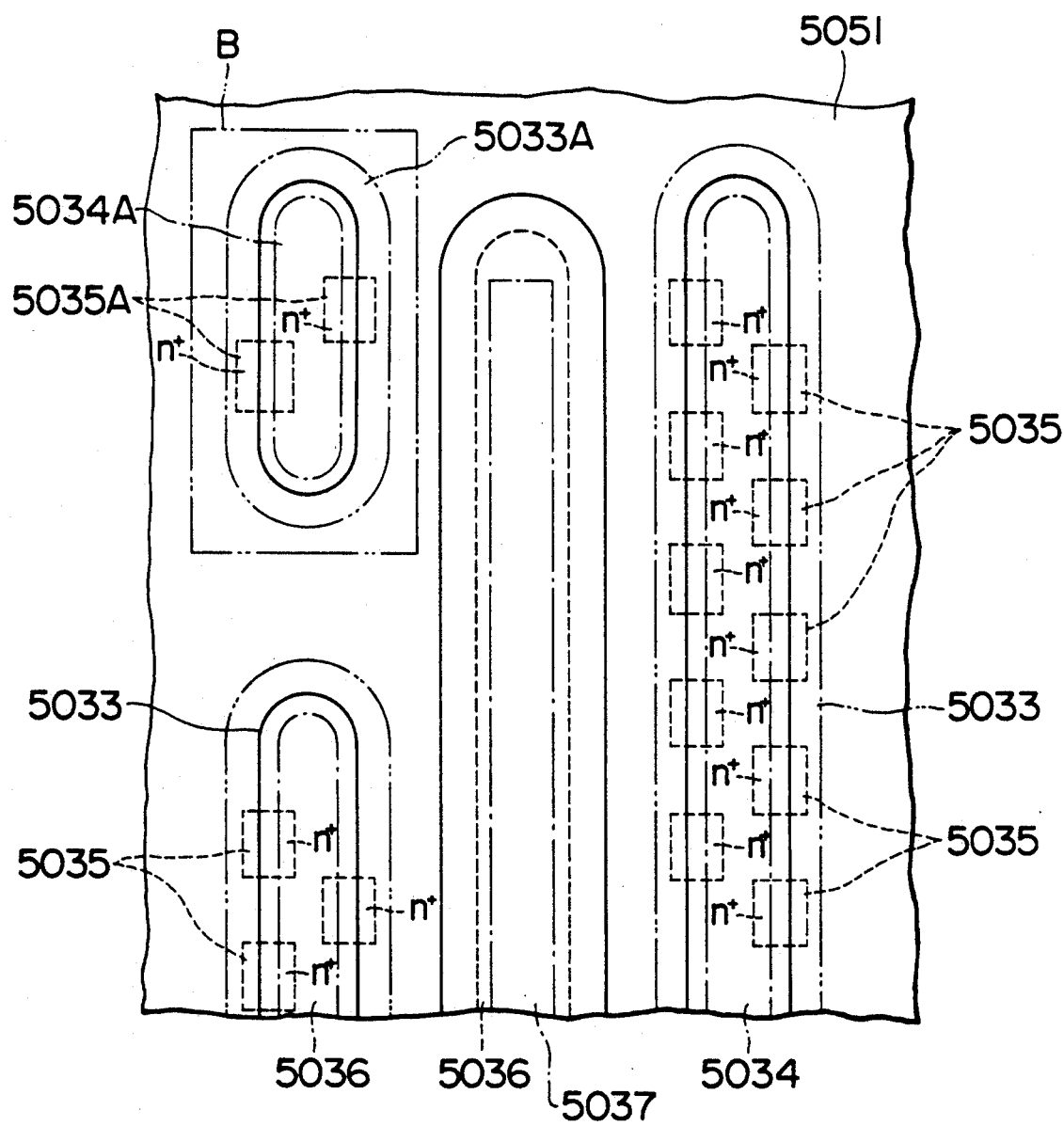
FIG. 7 is a plan view of a part of the LIGBT at the lower arm side.

FIG. 7 is a partial plan view of the LIGBT which is used as the lower arm switching elements $Q_2$, $Q_4$ and $Q_6$. This LIGBT has the same structure as the LIGBT at the upper arm side excluding the area indicated by B in FIG. 6B. In other words, the LIGBT of the lower arm side needs to have current detection terminals $T_{A2}$, $T_{A3}$ and $T_{A6}$ in order to take out a part of the main current for the detection of the main current, and therefore has these terminals in the area B.

In the area B, an auxiliary p layer 5033A is provided with distance from the p layer 5033 within the n+ layer 5031, an auxiliary p+ 5034A is provided within the auxiliary p layer 5033A, and further an auxiliary n+ layer 5035A is provided within the auxiliary p layer 5033A and the auxiliary p+ layer 5034A so as to be adjacent to these two layers. Further, a current detection terminal $T_{A2}$ ($T_{A4}$ and $T_{A6}$) is in ohmic contact with the auxiliary n+ layer 5035A and the auxiliary p+ layer 5034A. While the gate electrode is not shown, the polysilicone layer 5051 provided outside the area B is extended to the area B for use as the gate electrode. The current flowing through the current detection terminal is determined by the ratio of the sum of the widths of the auxiliary n+ layer 5035A and the n+ layer 5035 in the longitudinal direction. When the ratio is large, the current flowing through the current detection terminal becomes small and there arises a problem of noise making it difficult to compare the current with the reference current. On the other hand, when the ratio is small, a large current flows through the current detection terminal resulting in an increase in the loss. Therefore, the ratio of 200 to 2000 is desirable.

In the present embodiment, the p+ layer 5034 has $1 \times 10^{18}$ to $1 \times 10^{19}$ cm$^{-3}$ with the diffusion depth 3 to 5 $\mu$m, the p layer 5033 has $1 \times 10^{16}$ to $1 \times 10^{17}$ cm$^{-3}$ with the diffusion depth 3 to 6 $\mu$m, the n+ layer 5035 has $1 \times 10^{18}$ cm$^{-3}$ or above, with the diffusion depth 1 $\mu$m or below, the p+ layer 5037 has $1 \times 10^{18}$ cm$^{-3}$ or above, with the diffusion depth 1 $\mu$m or below, the n layer 5036 has $1 \times 10^{-16}$ to $3 \times 10^{17}$ cm$^{-3}$, with the diffusion depth 3 to 6 $\mu$m, the n+ layer 5035A has $1 \times 10^{18}$ cm$^{-3}$ or above, with the diffusion depth 6 to 12 $\mu$m, and the n$^{-3}$ layer 5031 has $1 \times 10^{14}$ to $5 \times 10^{14}$ cm$^{-3}$, with the thickness 30 to 50 $\mu$m.

It is desirable that the SiO$_2$ film 5041 has the thickness of 500 Å to 1200 Å, the SiO$_2$ film 5042 has the thickness of 0.5 to 1.5 $\mu$m, the SiO$_2$ film 5044 has the thickness of 2.0 $\mu$m or above, the PSG 5043 has the thickness of 0.5 $\mu$m or above, and the SiO$_2$ film 502 has the thickness of 2 $\mu$m or above.

Diodes

Perspective Cross Section

Figure 8A:
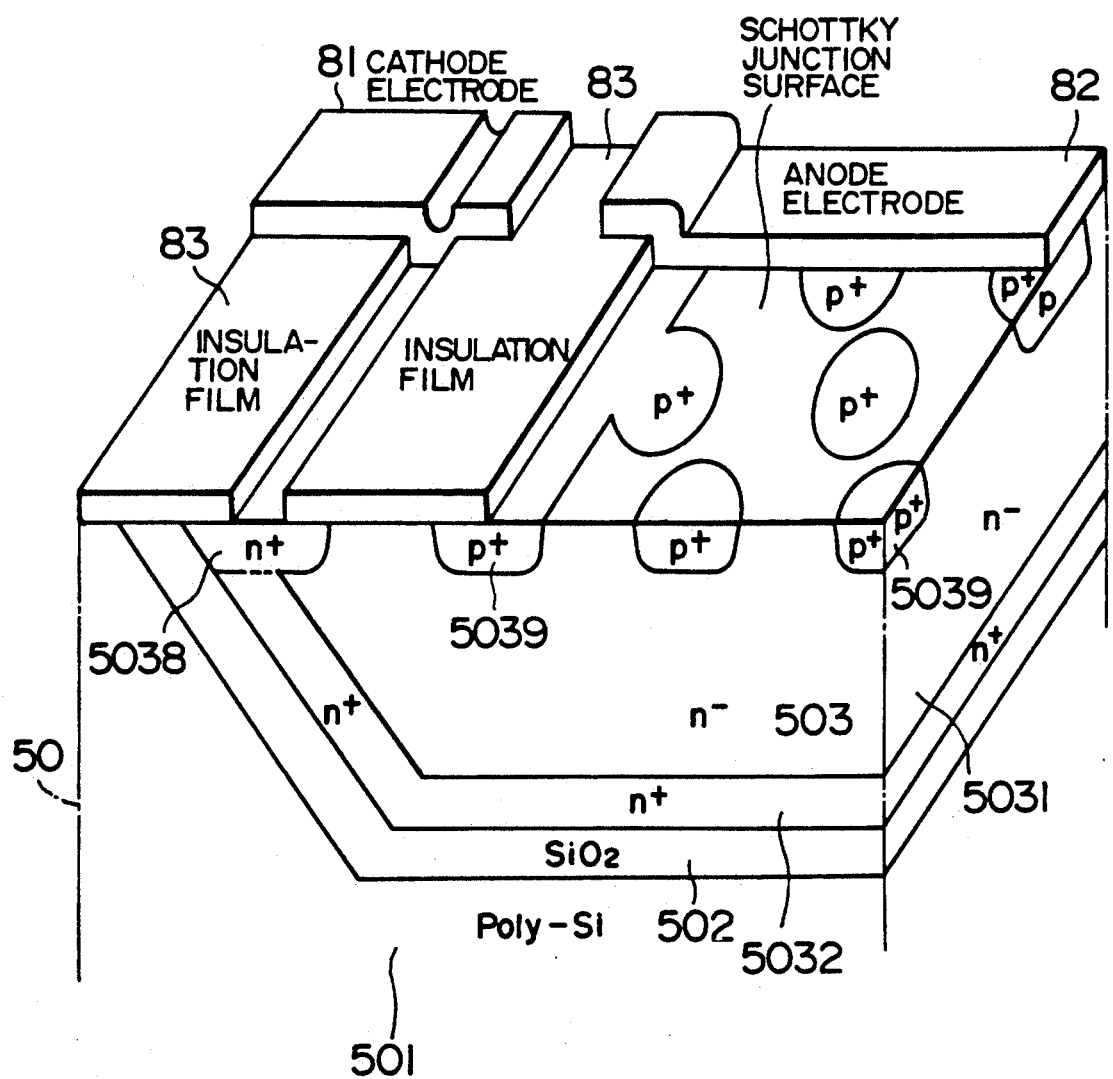
FIGS. 8A and 8B are perspective cross sectional views of the diode.

FIG. 8a is a perspective cross section of the diodes $D_1$ to $D_6$ which are inverse parallel connected to the switching elements of the inverter circuit. Each one diode is formed within the island area 503 of the dielectric isolated substrate. The n+ layer along the n+ layer 5031 and the SiO$_2$ film 502 is the same as the one shown in FIG. 5. The n+ layer 5038 is provided near the surface of the n+ layer 5032 and is in ohmic contact with the cathode electrode 81.

The p+ area 5039 is selectively formed near the surface of the n$^-$ layer 5031, and the anode electrode 82 is in contact with the exposed surfaces of the p+ area 5039 and the n$^-$ layer 5031. The anode electrode 82 is formed with a material forming a Schottky barrier in the n$^-$ layer 5031. The insulation film 83 is formed between the p+ layer 5039 and the n+ layer 5038. The anode electrode 82 extends to the exposed portion of the n+ layer 5038 over the insulation film 82. By this arrangement, the depletion layer is extended to reduce the electric field.

The Schottky junction surface is formed as follows. After the p+ layer 5039 is formed, the p+ layer 5039 and the n$^-$ layer 5031 are exposed, on top of which an aluminum and silicon alloy (hereinafter referred to as Al-Si) is deposited, and then these are heated. The Al-Si and the p+ layer are in ohmic contact with each other and the Al-Si and the n$^-$ layer are in Schottky contact with each other.

The diode operates as follows. When the cathode electrode 81 is applied with the ground potential and the anode electrode 82 is applied with a positive potential so that they are forward biased, holes are injected from the p+ layer 5039 and electrons are injected from the n+ layer 5032 and the n− layer is conductivity modulated so that the resistance is lowered. Therefore, the on-voltage becomes lower than the Schottky diode. When the anode electrode 82 is applied with a negative potential to change its forward bias state to the bias state, there is less excess carrier near the Schottky junction than at the vicinity of the pn junction, so that the recovery current is smaller than that of the pn diode.

The p+ layer 5039 is formed by a plurality of circular portions and disk portions surrounding these in the plan view. However, the shapes are not limited to these, and the circular portions may be polygonal or grid or stripe shape, for exmaple.

Figure 8B:
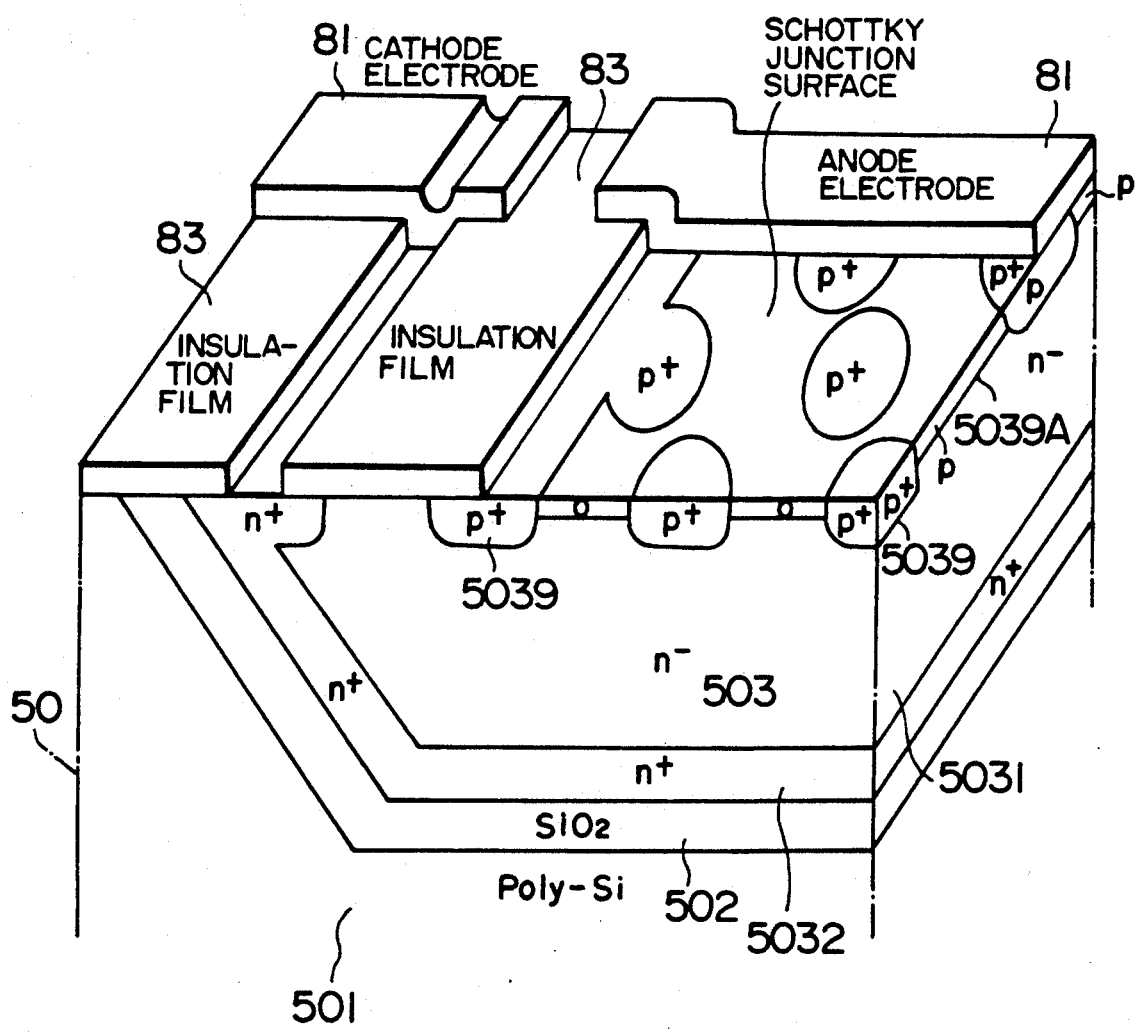

FIG. 8B shows an example of another diode, which is different from FIG. 8A in that a thin p layer 5039A is formed immediately beneath the Schottky junction. Since there is a pn junction beneath the Schottky junction, the height of the barrier of the Schottky junction becomes larger and the leakage current becomes smaller than that of the diode in FIG. 8A.

It is desirable that the depth of the p layer 5039A is 1000 Å or smaller. The p layer 5039A is formed by depositing the Al-Si alloy as the Schottky alloy layer and then heat-processing it at the temperature range of 430° C. to 577° C.

Plan View

Figure 9A:
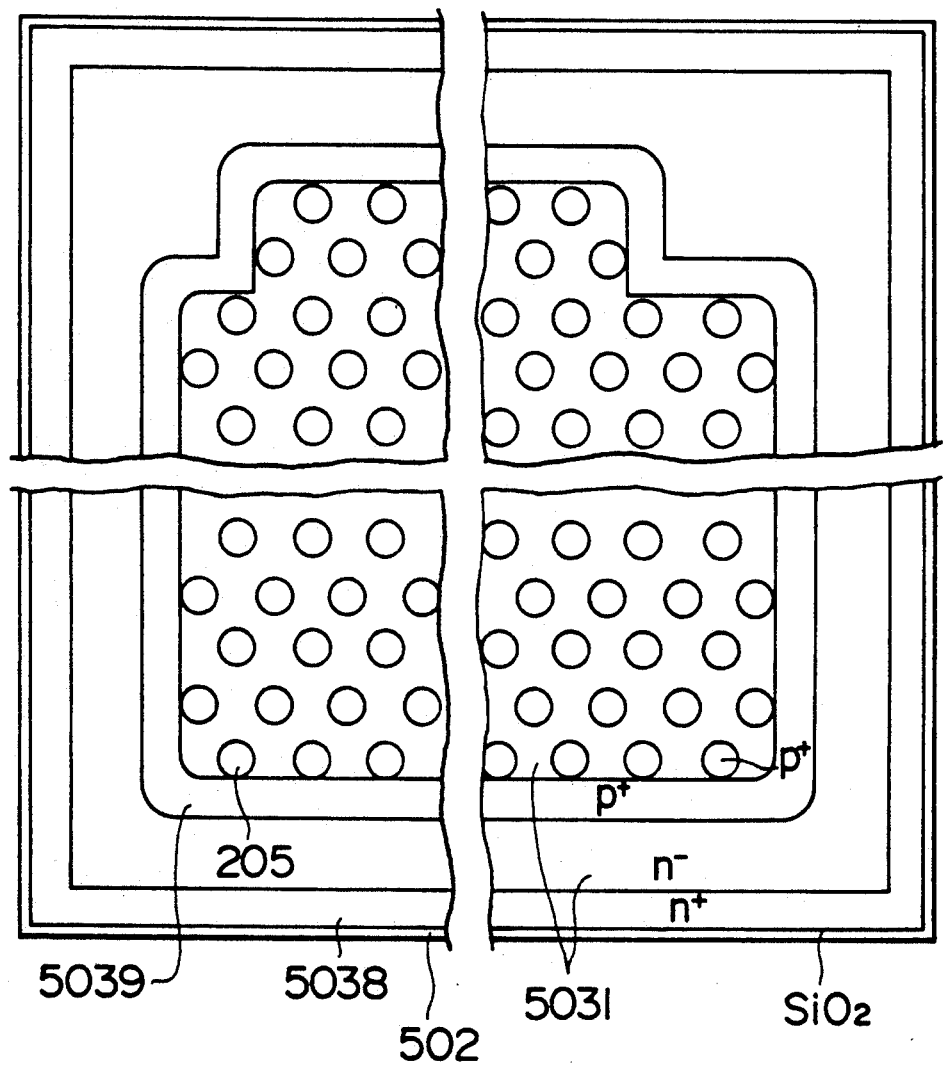
FIG. 9A is a plan view of the diffusion layer of the diode.

FIG. 9A is a plan view of the diode. The circular p+ layers 5039 are disposed such that these centers are positioned at the peak of the regular triangle formed between the adjacent layers. A disk-shaped p+ layer 5039 is formed around the circular p+ layer 5039. The corner of the disk-shaped p+ layer 5039 has a curvature to prevent a concentration of the electric field. The n− layer 5031 surrounded by the disk-shaped p+ layer 5039 and the circular p+ layer have convex forms.

Figure 9B:
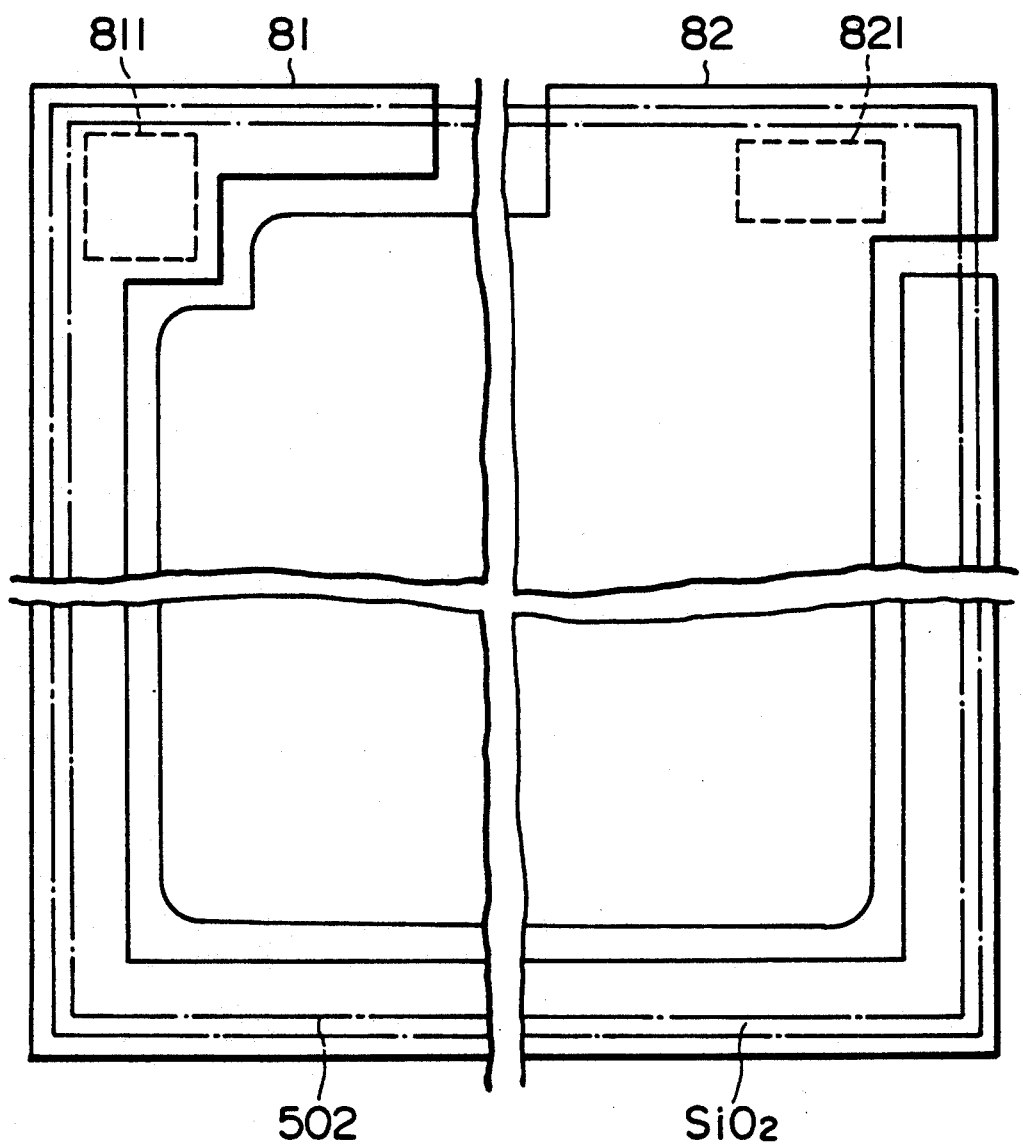
FIG. 9B is a plan view of the electrode of the diode.

FIG. 9B is a plan view of the electrode of the diode. The cathode electrode 81 is formed along the outermost periphery of the element and is in ohmic contact with the exposed area of the n+ layer 5038. The anode electrode 82 extends from the p+ layer 5039 to the n+ layer 5038 over the insulation film 83, and is partly drawn to the outside of the element. The so-called cathode electrode pad 811 and the anode electrode pad 821 which are the areas for taking out the wiring from the cathode electrode 81 to the outside of the IC, are formed on the insulation film 83 within the element.

The p+ layer 5034 of the LIGBT and the p+ layer 5039 of the diode are manufactured in the same method. In the present embodiment, it is desirable that the p+ layer 5039 has $1\times10^{18}$ to $1\times10^{19}$ cm$^{-3}$, with the diffusion depth 3 to 5 μm, the n+ layer 502 has $1\times10^{18}$ cm$^{-3}$ or above, with the diffusion depth 6 to 12 μm, the n− layer 5031 has $1\times10^{14}$ cm$^{-3}$ to $5\times10^{14}$ cm$^{-3}$, with the thickness 30 to 50 μm, the insulation film 83 has the thickness of 2.5 μm or above, and the SiO$_2$ 502 has the thickness of 2 μm or above.

Electron Beam Irradiation

In order to speed-up the LIGBT and the diode, an electron beam is irradiated. It is known that when an electron beam is irradiated to a semiconductor element the time of minority carriers is short and the elements speed up. However, the on-voltage increases in this case because the conductivity modulation becomes difficult.

In order to simplify the process, the electron beam is irradiated at the stage of a wafer prior art to it being cut into chips. In other words, the electron beam of the same quantity is irradiated to the LIGBT and the diode. For the descrete elements, optimum quantity of electron beam irradiation can be selected for each of the IGBT and the diode. However, since electron beam of the same quantity is irradiated to the integrated circuit unit of the present invention, it is impossible to irradiate optimum quantities of electron beam to the LIGBT and the diode separately.

Figure 10:
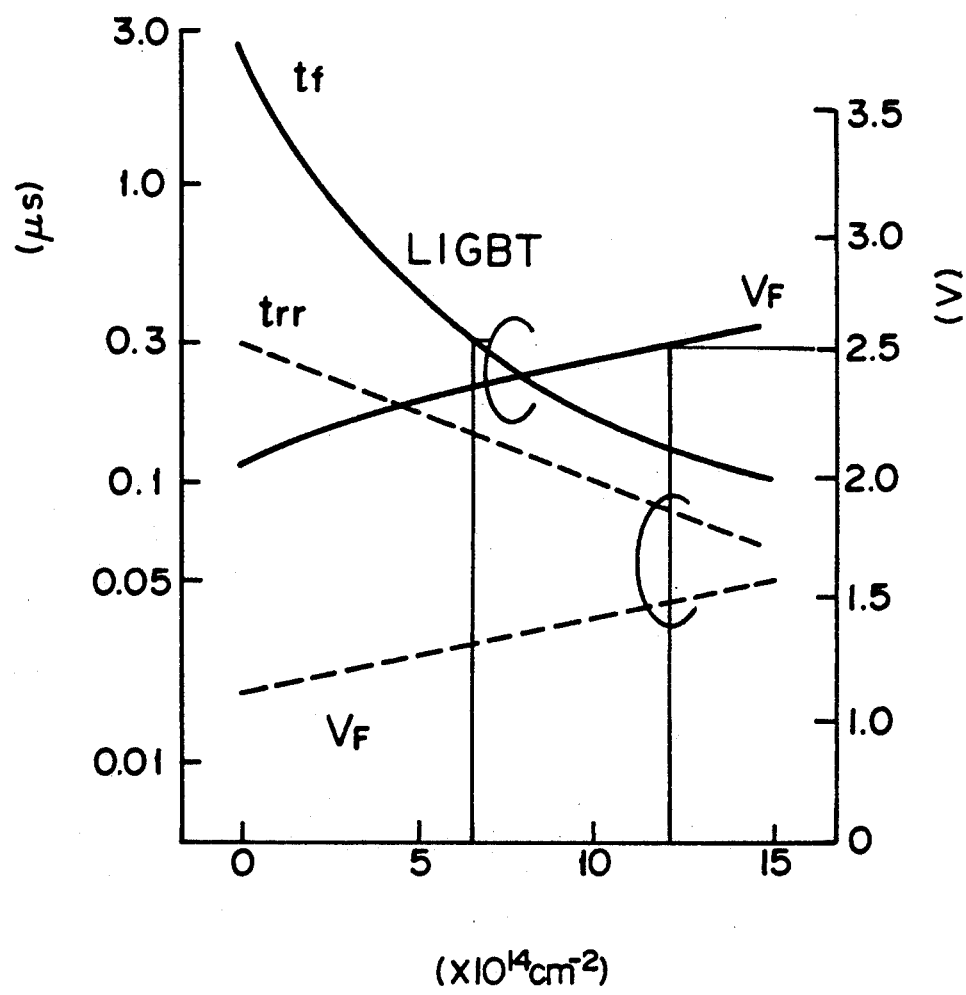
FIG. 10 is a diagram showing the relationship between the electron beam irradiation dose and the electric characteristics of the LIGBT and diode.

FIG. 10 shows the relationship among the electron beam irradiation dose, a LIGT turn-off time $t_f$, a reverse recovery time $t_{rr}$ of the diode and LIGBT and diode on-voltage $V_F$. The turn-off time $t_f$ represents the time taken from when the gate of the LIGBT is turned off to when the current changes from 90% to 10%. The reverse recovery time represents the time taken from when current once becomes zero to when current flows backward and again the current becomes zero, when a forward current is applied to the diode and then a reverse bias is applied.

In order to operate in the switching frequency of 16 kHz or above, it is necessary that the $t_f$ becomes 0.3 μs or below and the $t_{rr}$ becomes 0.15 μs or below. On the other hand, it is desirable that the on-voltage $V_F$ is 2.5 V or below from the loss for the LIGBT and 1.5 V or below for the diode. The electron beam irradiation quantity which satisfies all the characteristics is $6.5\times10^{14}$ to $1.2\times10^{15}$ cm$^{-3}$. The electron beam irradiation of this range is effected in the IC of the present invention.

What is important in the present invention is that electron beam should be irradiated to not only the LIGBT and the diode but to the whole semiconductor chips. In this case, it is devised to compensate against undesirable impact due to the electron beam irradiation at portions other than the LIGBT and the diode. For example, when a circuit is structured by the MOS transistor, the threshold value voltage varies due to the electron beam irradiation. Therefore, the element is designed by taking into account estimated variation quantity due to the electron beam irradiation in advance so that the above bad influence is eliminated.

Layout of the IC

Figure 11:
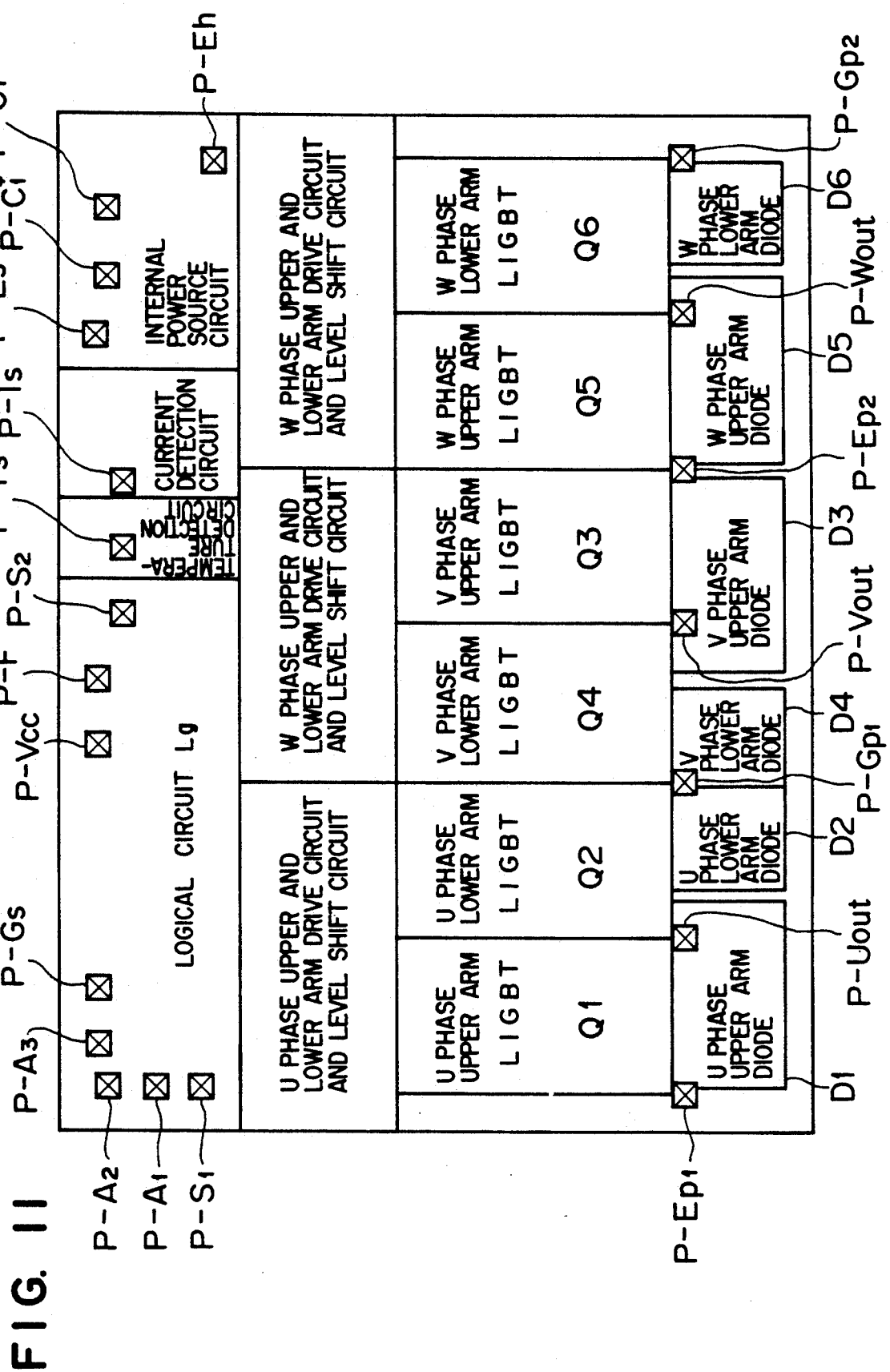
FIG. 11 is a layout diagram of the IC.

FIG. 11 shows a layout pattern of the integrated circuit of the present invention. As shown in the diagram, a logical circuit $L_g$, a current detection circuit $I_s$, a drive circuit level shift circuit $L_s$ for each phase of U, V and W, upper and lower arm LIGBT $Q_1$ to $Q_6$ for each phase of U, V and W and diodes $D_1$ to $D_6$ connected in inverse parallel with the LIGBT's are disposed in the IC chip.

A logical circuit $L_g$ is disposed above the square IC chip. A temperature detection circuit $T_s$ and a current detection circuit $I_s$ are disposed at the right side of the logical circuit, and an internal power source circuit $P_s$ is disposed at the right side of the $I_s$.

The U phase upper and lower arm drive circuits and level shift circuit, the V phase upper and lower arm drive circuits and level shift circuit and the W phase upper and lower arm drive circuits and level shift circuit are disposed from the left side, at the lower side (the front side on the diagram) of the logical circuit $L_g$, the temperature detection circuit, the current detection circuit and the internal power source circuit $P_s$.

At the lower side of the drive circuits, etc., there are provided from the left to the right, the U phase upper arm LIGBT $Q_1$, with the collector electrode drawn on the left side, the U phase lower arm LIGBT $Q_2$, with the collector electrode drawn on the left side, the V phase lower arm LIGBT $Q_4$, with the emitter electrode drawn on the left side, the V phase upper arm LIGBT $Q_3$, with the emitter electrode drawn on the left side, the W phase upper arm LIGBT $Q_5$, with the collector electrode drawn on the left side, and the W phase lower arm LIGBT $Q_6$, with the collector disposed at the left side. The emitter electrode of the U phase upper arm LIGBT $Q_1$ and the collector electrode of the U phase lower arm LIGBT $Q_2$ are connected together to form one wiring area. The emitter electrode of the U phase lower arm LIGBT $Q_2$ and the emitter electrode of the V phase lower arm LIGBT $Q_4$ are connected together to form one wiring area. The collector electrode of the V phase lower arm LIGBT $Q_4$ and the emitter electrode of the V phase upper arm LIGBT $Q_3$ are connected to form one wiring area. The collector electrode of the V phase upper arm LIGBT $Q_3$ and the collector electrode of the W phase upper arm LIGBT $Q_5$ are connected together to form one wiring area. The emitter electrode of the W phase upper arm LIGBT $Q_5$ and the collector electrode of the W phase lower arm LIGBT $Q_6$ are connected together to form one wiring area.

At the lower side of the lateral IGBT of the main inverter circuit, there are provided from the left to the right, the U phase upper arm diode $D_1$, the U phase lower arm diode $D_2$, the V phase arm diode $D_4$, the V phase upper arm diode $D_3$, the W phase upper arm diode $D_5$ and the w phase arm diode $D_6$.

The present layout diagram shows the case where three signals of $A_1$ to $A_3$ are received from the signal generating circuit and these signals are divided into signals of six surfaces for the upper and lower arms of U, V and W respectively by the logical circuit. On the upper side of the IC chip, there are provided from the left to the right along the periphery, a P-S, pad for the carrier signal from the microcomputer, P-$A_1$, P-$A_2$ and P-$A_3$ pads for drive signals from the signal generation circuit, a ground line pad P-$G_s$, a low voltage power source pad P-Vcc, a signal transmission pad P-F for transmitting signals to the signal generation circuit when a fault state occurs, a pad P-$R_E$ for the reference resistance of the detection circuit, a carrier signal pad P-$S_2$ for the internal power source, a pad P-E for the high voltage power source, a pad P-$C_1^-$ for the capacitor $C_1$ low potential side, a pad D-$C_1^+$ for the capacitor $C_1$ high potential side, a pad D-$C_2^-$ for the capacitor $C_1$ high potential side and a pad P-$E_h$ for the capacitor $C_2$ high potential side.

At the lower side of the chip, there are provided from the left to the right, a pad P-$E_{p1}$ for the high voltage power source by connecting the collector electrode of the U phase upper arm LIGBT $Q_1$ and the cathode electrode of the U phase upper arm diode $D_2$, a pad P-$U_{out}$ for the U phase output by connecting the emitter electrode of the U phase upper arm LIGBT $Q_1$, the collector electrode of the U phase lower arm LIGBT $Q_2$, the mode electrode of the U phase upper arm diode $D_1$ and the cathode electrode of the U phase lower arm diode $D_2$, a pad P-$G_{p1}$ for the grounding by connecting the emitter electrode of the U phase lower arm LIGHT $Q_2$, the emitter electrode of the V phase lower arm LIGHT $Q_4$, the anode electrode of the U phase lower arm diode $D_2$ and the anode electrode of the V phase lower arm diode $D_4$, a pad P-$V_{out}$ for the V phase output by connecting the collector electrode of the V phase lower arm LIGBT $Q_4$, the emitter electrode of the V phase upper arm LIGBT $Q_3$, the cathdoe electrode of the V phase lower arm diode $D_4$ and the anode electrode of the V phase upper arm diode $D_3$, a pad P-$E_{p2}$ for the high voltage power source by connecting the collector electrode of the V phase upper arm LIGBT $Q_3$, the collector electrode of the W phase upper arm LIGBT $Q_5$, the cathode electrode of the V phase upper arm diode $D_3$ and the cathode electrode of the W phase upper arm diode $D_5$, a pad P-$W_{out}$ for the W phase output by connecting the emitter electrode of the W phase upper arm LIGBT $Q_5$, the collector electorde of the W phase lower arm LIGBT $Q_6$, the anode electrode of the W phase upper arm diode $D_5$ and the cathode electrode of the W phase lower arm diode $D_6$, and a pad P-$G_{p2}$ for the grounding by connecting the emitter electrode of the W phase lower arm LIGBT $Q_6$ and the anode electrode of the W phase lower arm diode $D_6$.

As described above, a plurality of high voltage power source pads and grounding pads are provided, and they are connected outside of the IC so that the wiring area inside the IC is reduced.

The high voltage power source pads and the grounding pads are divided into the pads P-$E_{p1}$, P-$E_{p2}$, P-$G_{p1}$ and P-$G_{p2}$ through which a large current (0.6 A or above) flows and the pads P-$G_s$ and P-$E_s$ through which a small current (0.1 A or below) flows, and these are electrically insulated inside the IC. By this arrangement, a potential variation due to switchings of a large current does not affect the wiring through which a small current flows.

The LIGBT which switches a large current and the logical circuit are separated through the level shift circuit so as to prevent malfunction of the logical circuit due to noise generated by the switching of the LIGBT.

In the integrated circuit unit of the present invention, chopping by pulse width modulation is carried out by the lateral IGBT at the lower arm side. Accordingly, little current flows through the diode of the lower arm. Therefore, the increase in the overall loss is small even if the area of the diode at the lower side is made small and the forward voltage becomes large. By reducing the area of the diode at the lower arm side, the chip area can be made small without substantially increasing the loss of the IC.

The layout diagram in FIG. 11 shows the case where the dielectric isolated substrate is used, and the LIGBT and the diode can be formed by one element in one island area, and for other parts, whether one or a plurality of elements are to be formed in one island area is to be suitably decided depending on the circuit voltage.

Manufacturing Process of the Integrated Circuit Unit

FIGS. 12A to 12M show the manufacturing process of the integrated circuit unit. In the diagrams, areas X and Y show partial cross sections for each process to obtain the LIGBT and the diode respectively.

Figure 12A:
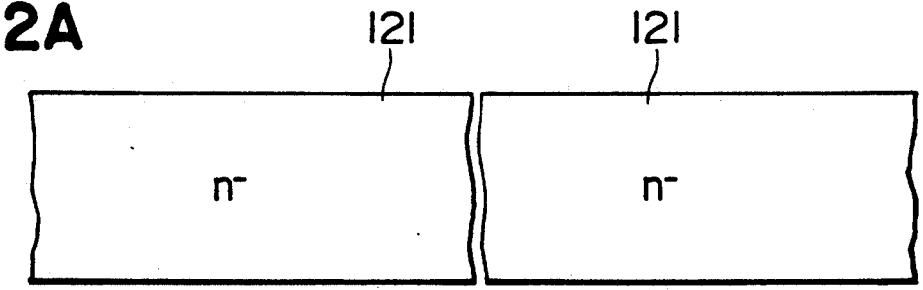
FIGS. 12A to 12M are manufacturing process diagrams of the IC unit.

First, as shown in FIG. 12A, a semiconductor substrate 121 is prepared. It is desirable that an n type monocrystalline silicone having (100) crystalline surfaces having its specific resistance of $16\Omega$ to $24 \Omega \cdot cm$ is used as the semiconductor substrate 121.

Figure 12B:
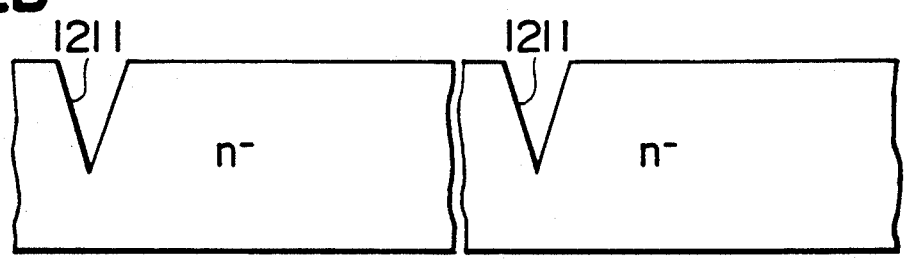

A groove 1211 is formed on the main surface of the silicone substrate as shown in FIG. 12B.

Figure 12C:
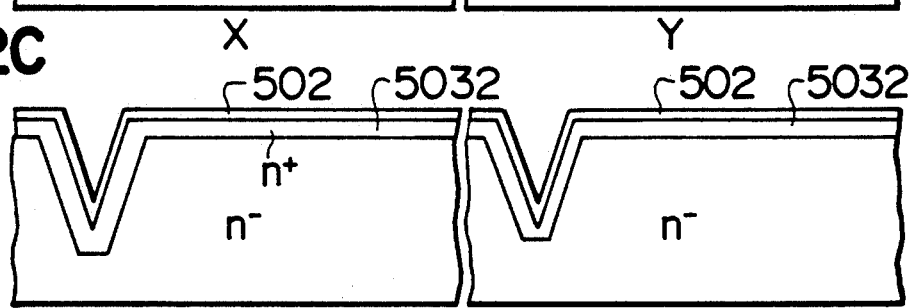

As shown in FIG. 12C, a n+ layer 5032 and an SiO2 film 502 are formed on the whole surface of the main surface of the semiconductor substrate 121 on which the groove 1211 has been formed. The n+ layer 5032 is formed by ion inplantating. It is desirable that its impurity is arsenic, with dose $1 \times 10^{15}$ cm$^{-2}$ or above. Further, the SiO2 film 502 should preferably have the thickness of about 2.0 μm.

Figure 12D:
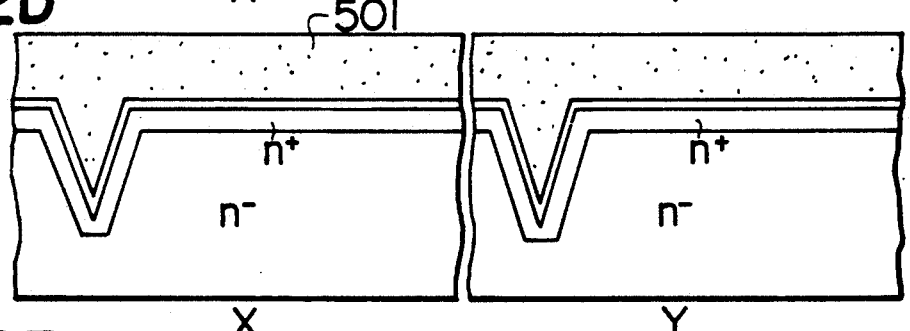

Then, as shown in FIG. 12D, polysilicone 501 is filed to form a supporting body on the SiO2 film 502.

Figure 12E:
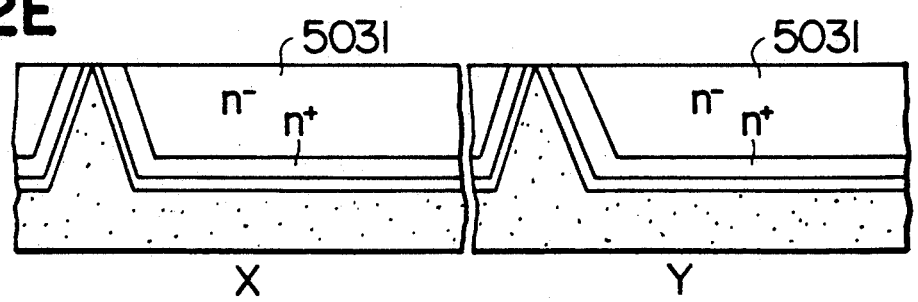

Then, as shown in FIG. 12E, the surface of the substrate 121 is shaved to reach the groove 1211. The n− layer 121 and the remaining substrate portion are mutually insulation separated by the SiO2 film 502 to form the n− layer 5031.

Figure 12F:
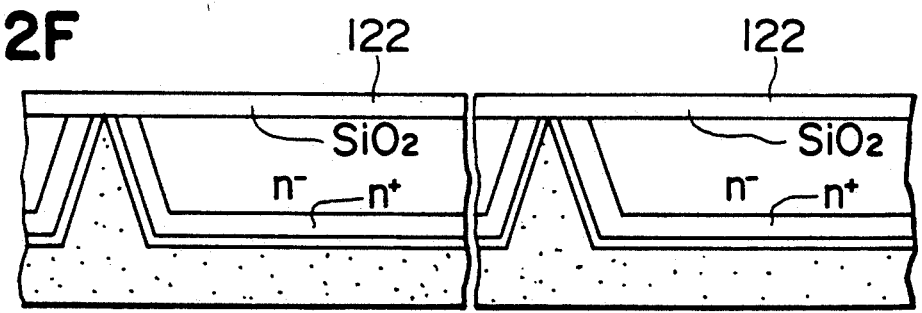

Then, as shown in FIG. 12F, the SiO2 film 122 is formed on the whole surface. The SiO2 film should preferably have the thickness of about 2.2 μm.

Figure 12G:
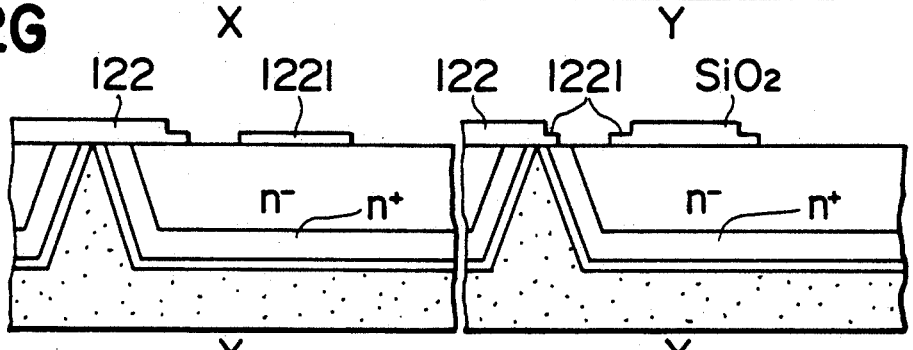

This SiO2 film 122 is selectively etched FIG. 12G. The etching process includes the etching to form an SiO2 film 1221 which is thinner than the SiO2 film 122 and the etching to expose the surface of the n− layer 5031. The SiO2 film 1221 should preferably have the thickness of about 0.9 μm. Thus, there are two etchings to stagedly make the SiO2 films thinner for the purpose of preventing disconnection of the wirings due to a large stage difference between the thick oxide film and the silicone.

Figure 12H:
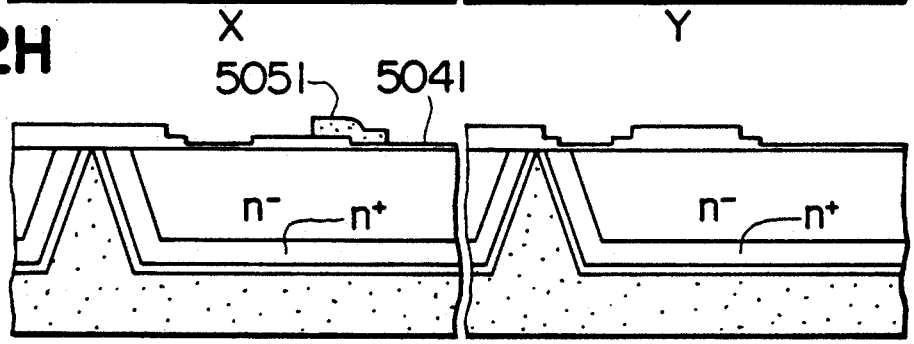

Next, the thin SiO2 film 5041 for the MOS gate is heat oxideized on the whole surface, and a polysilicone layer 5051 is formed on the SiO2 film 1221 FIG. 12H and the thin SiO2 film 5041. As an impurity, phosphorus is introduced into the polysilicone layer, thereby to lower the resistance. The sheet resistance of the polysilicone layer should preferably be about 10Ω/□ and the introduction may be preferably by the deposition of POCl3.

Figure 12I:
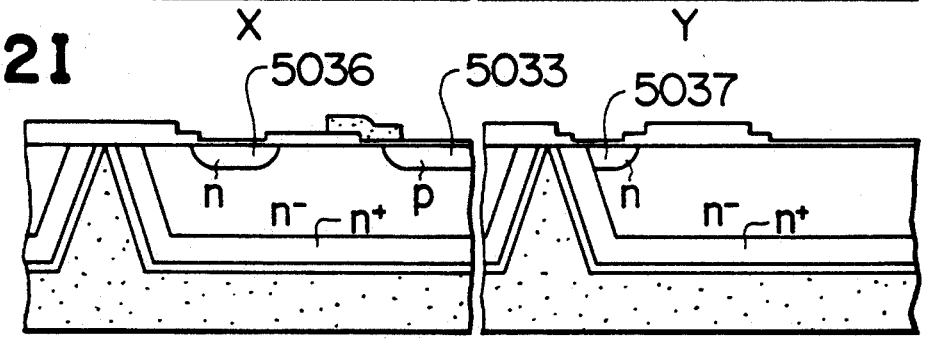

Next, as shown in FIG. 12I, the n layers 5036, 5037 and the p layer 5033 are selectively formed. In this case, the SiO2 films 122 and 1221 and the polysilicone layer are used as masks. As the impurity of the n layer 5036, phosphorus is desirable. The impurity is introduced preferably by ion implanting, with acceleration voltage 125 KeV and dose $1 \times 10^{14}$ cm$^{-3}$. Further, boron is preferable as the impurity of the p layer 5033. The impurity is introduced preferably by ion implanting, with acceleration voltage 75 KeV and dose 0.8 to $1.2 \times 10^{14}$ cm$^{-2}$.

Figure 12J:
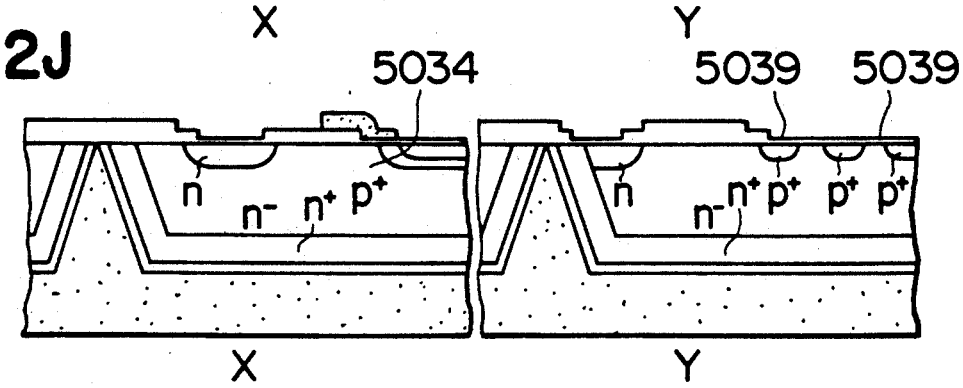

Then, as shown in FIG. 12J, p+ layers 5034 and 5039 are selectively formed. The p+ layers 5034 and 5039 are formed in the same method. Boron is preferable for their impurity. The impurity is introduced preferably by ion implantation, with acceleration voltage 80 KeV and dose quantity $2 \times 10^{15}$ cm$^{-2}$.

Figure 12K:
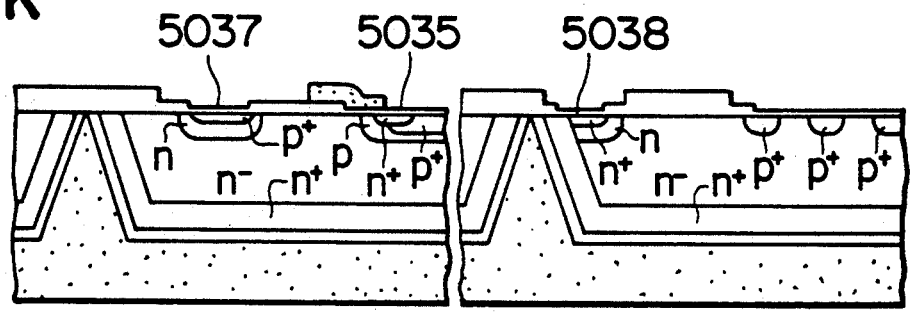

Then, as shown in FIG. 12K, n+ 5035 and p+ layers 5037 and 5038 are selectively formed. In the diode, n layer 5037 and n+ layer 5038 are formed at the end portion in order to lower the contact resistance of the n+ layer 5032 and the cathode electrode 81. The n+ layer 5035 of the LIGBT is formed by self-alignment with the p layer 5033 by using the polysilicone layer as a mask, to prevent mask deviation and to reduce a channel width. Phosphorus is desirable as the impurity of the n+ layer 5035. The formation of the impurity is preferably by the deposition of POCl3, with the resistance about 10Ω/□.

Figure 12L:
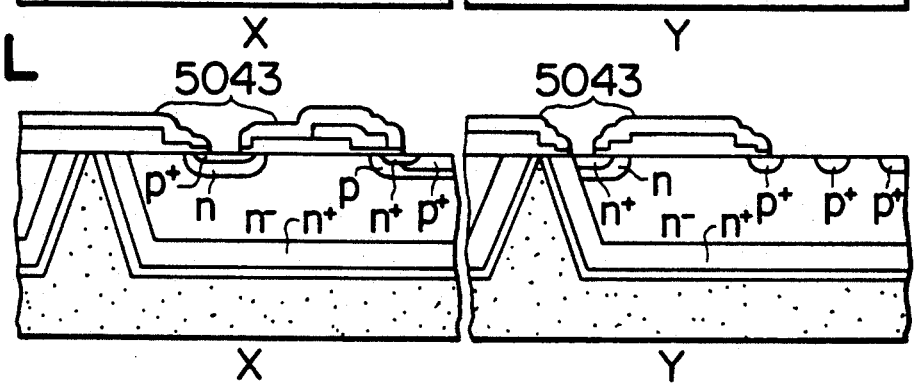

Next, as shown in FIG. 12L, a PSG (Phospho-silicate glass) 5043 is formed on the whole surface, then is selectively removed to have holes to allow a contact between the electrode and the diffusion layer. The PSG 5043 prevents to have a contact between the polysilicone layer 5051 and the emitter electrode 5052, thereby to prevent a short-circuiting between the gate and the emitter. By overlapping an SiO2 film 122 with the PSG 5043, the electric field between the wiring and the n+ layer 5032 is reduced and the blocking voltage is increased. The PSG 5043 has preferably the thickness of about 1.2 μm.

Figure 12M:
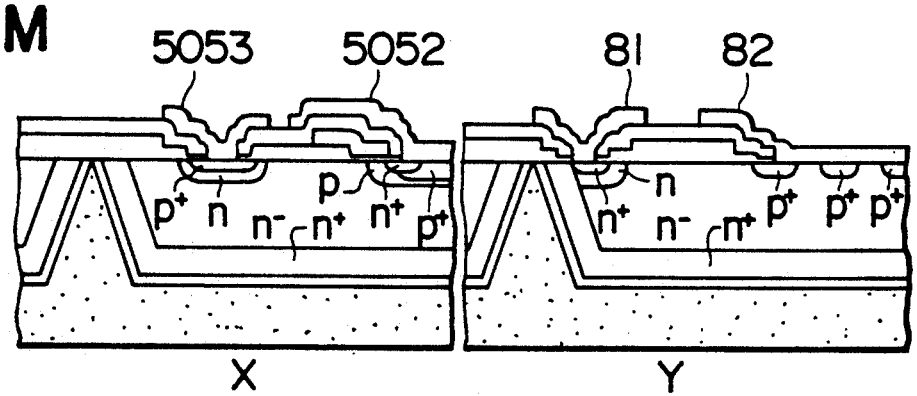

Then, as shown in FIG. 12M, an Al-Si alloy is piled on the whole surface and is further selectively removed by a photolithographic process and an etching process, to form electrodes 5052, 5053, 81 and 82.

Then, although not shown in the diagram, a protection film is deposited on the whole surface and the electron beam is irradiated in the wafer state, the whole is heat processed in hydrogen and then is cut into chips, to complete the IC. The heat processing in hydrogen is performed in order to recover the wafer from damages caused by the electron beam irradiation.

Figure 13:
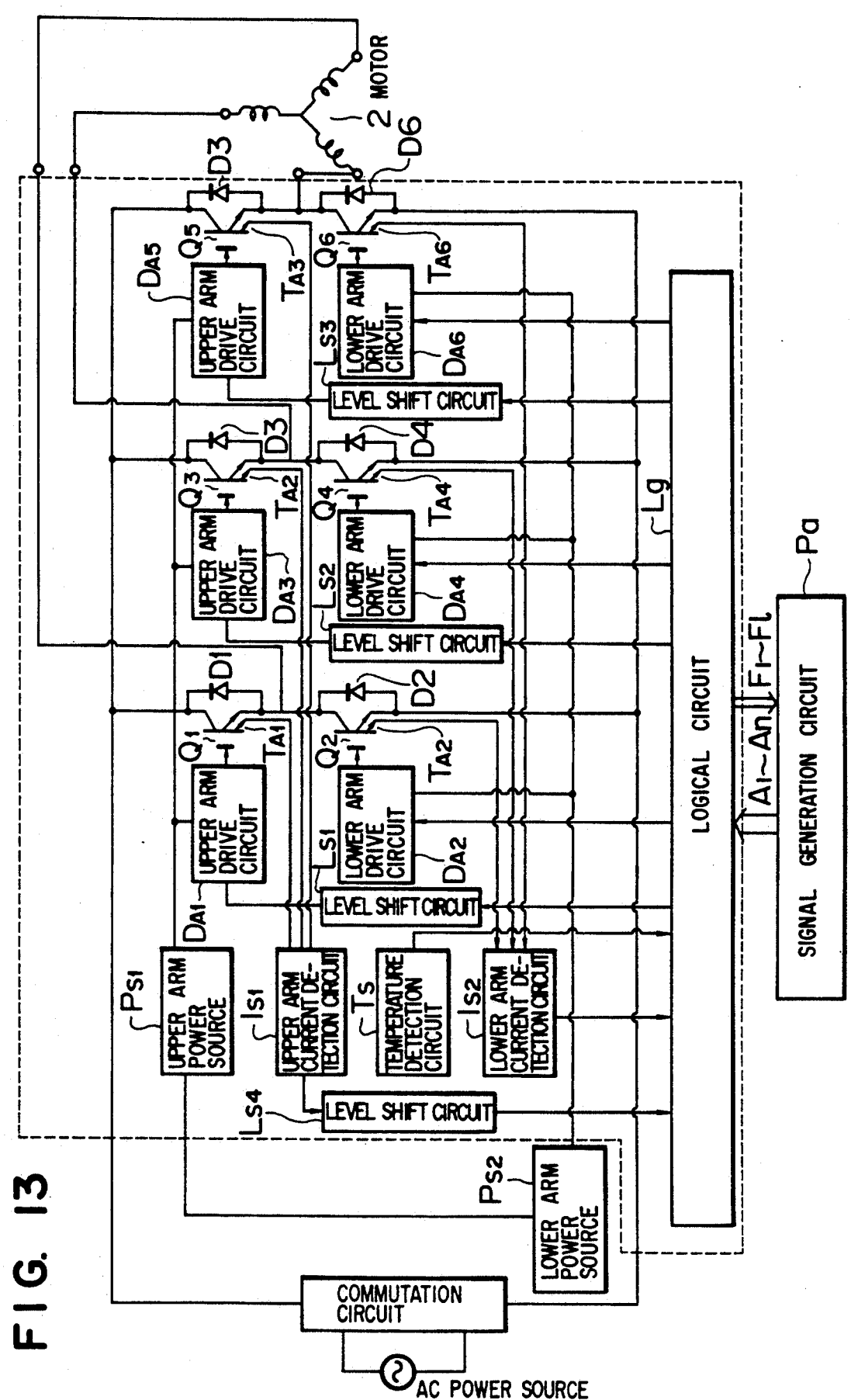
FIG. 13 is a block diagram showing another embodiment of the motor control system using the integrated circuit unit of the present invention.

Description has been made above about the case of controlling the three-phase brushless motor. The integrated circuit unit of the present invention can also be applied to the control of other kinds of motor having a DC of 100 V or above as the power source. FIG. 13 shows the configuration of the general motor control system using the integrated circuit unit of the present invention. In the present embodiment, the portion encircled by the dotted line in the diagram is integrated in one chip. This integrated circuit unit comprises a three-phase inverter circuit having LIGBT $Q_1$ to $Q_6$ and diodes $D_1$ to $D_6$ which are connected inverse parallel with these LIGBT $Q_1$ to $Q_6$, drive circuits $D_{A2}$, $D_{A4}$ and $D_{A6}$ of the lower arm LIGBT of the inverter circuit, drive circuits $D_{A1}$, $D_{A3}$ and $D_{A5}$ of the upper arm LIGBT, level shift circuits $L_{S1}$ to $L_{S4}$, an upper arm current detection circuit $I_{S1}$ for detecting the current flowing through the upper arm LIGBT $Q_1$, $Q_3$ and $Q_5$, a lower arm current detection circuit $I_{S2}$ for detecting the current flowing through the lower arm LIGHT $Q_2$, $Q_4$ and $Q_6$, an upper arm power source $P_{S1}$, a logical circuit $L_g$, and a temperature detection circuit $I_s$.

The operation of the integrated circuit unit having the above configuration will be explained below. While the switching by pulse width modulation is performed by the lower arm LIGBT $Q_2$, $Q_4$ and $Q_6$ in the three-phase brushless motor, the switching by pulse width modulation is performed by the upper and lower arm LIGBT $Q_1$ to $Q_6$ in the present embodiment.

A logical circuit $L_g$ receives control signals $A_1$ to $A_n$ from a signal generation circuit $P_a$, supplies these signals to the upper and lower arm drive circuits $DA_1$ to $D_{A6}$ of each phase, switches the LIGBT's and controls power supplied to a motor 2. The lower arm drive circuits $D_{A2}$, $D_{A4}$ and $D_{A6}$ are supplied with power from on external lower arm power source $P_{S2}$. The upper arm drive circuits $D_{A1}$, $D_{A3}$ and $D_{A5}$ are supplied with power, which is provided by converting the current inside by receiving it from the lower arm power source $P_2$, from the upper arm power source $P_{S1}$. A signal is transmitted from the low potential logical circuit $L_g$ to the high potential upper arm drive circuits $D_{A1}$, $D_{A3}$ and $D_{A5}$ through the level shift circuits $L_{S1}$, $L_{S2}$ and $L_{S3}$.

The main current is measured by taking out a part of the current flowing through the LIGBT $Q_1$ to $Q_6$ Since the currents of the upper and lower arm LIGBT's are detected, it is possible to detect an excess current even if the output terminal to the motor is short-circuited with the earth. This is more safe than the case where only the current of the lower arm LIGBT is measured. The current detection circuit is divided into an upper arm current detection circuit $I_{S1}$ and a lower arm current detection circuit $I_{S2}$. The signal of the upper arm current detector circuit $I_{S1}$ is converted from a high potential signal to a low potential signal through the level shift circuit $L_{S4}$, and is transmitted to the logical circuit $L_g$. A signal representing the size of the current from the upper arm current detection circuit $I_{S1}$ and the lower arm current detection circuit $I_{S2}$ and temperature signals $F_1$ to $F_l$ of a temperature detection circuit $T_s$ are transmitted to a signal generation circuit $P_a$ through the logical circuit $L_g$.

When switching is performed by pulse width modulation by the upper and lower LIGBT's, a current flows through the upper and lower arm diodes $D_1$ to $D_6$ for almost the same period. Therefore, the element areas of the upper arm diodes $D_1$, $D_3$ and $D_5$ and the lower arm diodes $D_2$, $D_4$ and $D_6$ are made the same.

As described above, according to the present invention, the inverter circuit and the drive circuit are formed on one same semiconductor substrate, so that wiring can be extremely shortened thereby to prevent malfunction due to noise. Accordingly, a motor control unit using the semiconductor integrated circuit of the present invention can be formed in a compact system with high reliability.

We claim:

1. A semiconductor integrated circuit characterized in that there are integrally formed within the same semiconductor substrate:
   a pair of DC terminals;
   a plurality of AC terminals equal in number to the number of phase of an AC power supply;
   a pair of auxiliary DC terminals;
   a control terminal;
   an inverter circuit including a plurality of inverter units connected in parallel to each other between said pair of DC terminals, said inverter units being equal in number to the number of phases of the AC power supply, each of said inverter units having two serially connected circuit element pairs each circuit element pair having an inverse-parallel-connected switching element and a diode, a middle point of said each inverter unit being connected to a corresponding one of said plurality of AC terminals;
   a first plurality of driving circuit for respectively driving the switching elements at one side of the inverter units of said inverter circuits;
   a second plurality of driving circuit receiving a power supply from said pair of auxiliary DC terminals, for respectively driving the switching elements at the other side of the inverter units of said inverter circuit;
   a logical circuit connected to receive a control signal from said control terminal, for transmitting the control signal to said first plurality of driving circuits and to said second plurality of driving circuits;
   a plurality of level shift circuits respectively interposed between said first plurality of driving circuits and said logical circuit; and
   an internal power supply circuit connected to said pair of auxiliary DC terminals for supplying power to said first plurality of driving circuits,
   wherein said semiconductor substrate has a rectangular main surface enclosed by first and second sides extending in parallel to each other and third and fourth sides extending in parallel to each other and intersecting said first and second side orthogonally,
   wherein said switching elements are arranged apart from said first side of said rectangular main surface and in a same direction as said first side,
   wherein said diodes are arranged between said first side of said rectangular main surface and a row of said switching elements, and arranged in a same direction as said first side,
   wherein said first plurality of driving circuits, said second plurality of driving circuits, and said plurality of level shift circuits are arranged between said second side of said rectangular main surface and the row of said switching elements, and arranged in a same direction as said second side, and
   wherein said logical circuit and said internal power supply circuit are arranged between said second side of said rectangular main surface and a row of said driving circuits, and arranged in a same direction as said second side.

2. A semiconductor integrated circuit according to claim 1, wherein each of said diodes has a rectification junction formed by a pn junction and a Schottky junction.

3. A semiconductor integrated circuit according to claim 1, further comprising a current detecting circuit for detecting a current flowing through the switching element at the other side of said each inverter unit of said inverter circuit and for supplying a detection signal to said logical circuit.

4. A semiconductor integrated circuit according to claim 1, wherein each of the switching elements of said inverter circuit is a lateral insulation gate bipolar transistor.

5. A semiconductor integrated circuit according to claim 1, wherein the semiconductor substrate is a dielectric isolated substrate.

* * * * *